(12) United States Patent
Bae et al.

(10) Patent No.: US 11,901,422 B2
(45) Date of Patent: Feb. 13, 2024

(54) SEMICONDUCTOR DEVICE HAVING FIN-TYPE ACTIVE PATTERNS WITH SHARED CONTACT PLUGS

(71) Applicant: SAMSUNG ELECTRONICS CO., LTD., Suwon-si (KR)

(72) Inventors: Deok Han Bae, Hwaseong-si (KR); Hyung Jong Lee, Osan-si (KR); Hyun Jin Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 41 days.

(21) Appl. No.: 17/224,269

(22) Filed: Apr. 7, 2021

(65) Prior Publication Data

US 2021/0257470 A1 Aug. 19, 2021

Related U.S. Application Data

(63) Continuation of application No. 16/406,472, filed on May 8, 2019, now Pat. No. 10,998,411, which is a (Continued)

(30) Foreign Application Priority Data

Apr. 3, 2017 (KR) .................. 10-2017-0042970

(51) Int. Cl.
*H01L 27/08* (2006.01)
*H01L 27/092* (2006.01)
(Continued)

(52) U.S. Cl.
CPC .............. *H01L 29/41775* (2013.01); *H01L 21/823475* (2013.01); *H01L 27/0886* (2013.01);
(Continued)

(58) Field of Classification Search
CPC ............ H01L 27/092; H01L 29/41775; H01L 23/528; H01L 29/78; H01L 21/823475;
(Continued)

(56) References Cited

U.S. PATENT DOCUMENTS 6,169,313 B1 1/2001 Tsutsumi et al.
8,569,126 B2 10/2013 Takao
(Continued)

FOREIGN PATENT DOCUMENTS

CN 102468175 A 5/2012
CN 103383964 A 11/2013
(Continued)

OTHER PUBLICATIONS

Chinese Office Action dated Oct. 18, 2022 for corresponding CN 201810295185.1.

*Primary Examiner* — Didarul A Mazumder
(74) *Attorney, Agent, or Firm* — Muir Patent Law, PLLC

(57) ABSTRACT

A semiconductor device includes a source/drain region in a fin-type active pattern, a gate structure adjacent to the source/drain region, and an insulating layer on the source/drain region and the gate structure. A shared contact plug penetrates through the insulating layer and includes a first lower portion connected to the source/drain region, a second lower portion connected to the gate structure, and an upper portion connected to upper surfaces of the first lower portion and the second lower portion. A plug spacer film is between the insulating layer and at least one of the first lower portion and the second lower portion and includes a material different from a material of the insulating layer.

17 Claims, 33 Drawing Sheets

Related U.S. Application Data continuation of application No. 15/844,960, filed on Dec. 18, 2017, now Pat. No. 10,347,726.

(51) Int. Cl.
  *H01L 29/417* (2006.01)
  *H01L 29/66* (2006.01)
  *H01L 29/78* (2006.01)
  *H01L 27/088* (2006.01)
  *H01L 29/06* (2006.01)
  *H01L 27/12* (2006.01)
  *H01L 21/8234* (2006.01)
  *H10B 10/00* (2023.01)
  *H01L 27/02* (2006.01)

(52) U.S. Cl.
  CPC ...... *H01L 27/0924* (2013.01); *H01L 27/1211* (2013.01); *H01L 29/0649* (2013.01); *H01L 29/41791* (2013.01); *H01L 29/66795* (2013.01); *H01L 29/785* (2013.01); *H10B 10/12* (2023.02); H01L 21/823425 (2013.01); H01L 27/0207 (2013.01)

(58) Field of Classification Search
  CPC .. H01L 29/161; H01L 21/76895; H01L 27/02
  USPC ......... 257/640; 438/724, 744, 757, 791, 954
  See application file for complete search history.

(56) References Cited

U.S. PATENT DOCUMENTS

| | | | |
|---|---|---|---|
| 9,812,400 | B1 | 11/2017 | Basker et al. |
| 9,837,539 | B1 | 12/2017 | Chen et al. |
| 9,899,522 | B1* | 2/2018 | Liu et al. ............... H01L 29/78 |
| 10,347,726 | B2 | 7/2019 | Bae et al. |
| 2013/0161722 | A1 | 6/2013 | Son et al. |
| 2013/0292777 | A1* | 11/2013 | Liaw ................... H01L 27/1104 |
| 2014/0346575 | A1* | 11/2014 | Chen ................ H01L 21/76816 |
| | | | 438/666 |
| 2015/0214367 | A1 | 7/2015 | Chang et al. |
| 2015/0364326 | A1 | 12/2015 | Xie et al. |
| 2016/0163649 | A1* | 6/2016 | Oosuka ............ H01L 21/28525 |
| | | | 438/283 |
| 2016/0284700 | A1* | 9/2016 | Yoon et al. .......... H01L 27/088 |
| 2016/0379925 | A1* | 12/2016 | Ok .................... H01L 21/76897 |
| | | | 438/666 |
| 2018/0247865 | A1 | 8/2018 | Adusumilli et al. |

FOREIGN PATENT DOCUMENTS

| | | |
|---|---|---|
| JP | 2008-235793 A | 10/2008 |
| JP | 2010-10590 A | 1/2010 |
| KR | 10-2008-0082426 A | 9/2008 |

* cited by examiner

SEMICONDUCTOR DEVICE HAVING FIN-TYPE ACTIVE PATTERNS WITH SHARED CONTACT PLUGS

CROSS-REFERENCE TO RELATED APPLICATIONS

This is a continuation of U.S. patent application Ser. No. 16/406,472 filed May 8, 2019, which is a continuation of U.S. patent application Ser. No. 15/844,960, filed Dec. 18, 2017, now U.S. Pat. No. 10,347,726 B2 issued Jul. 9, 2019, the entire contents of each which are hereby incorporated by reference.

Korean Patent Application No. 10-2017-0042970, filed on Apr. 3, 2017, and entitled, "Semiconductor Device," is incorporated by reference herein in its entirety.

BACKGROUND

1. Field

One or more embodiments described herein relate to a semiconductor device.

2. Description of the Related Art

The effort to make smaller, higher performance electronic devices continues to be a goal of system designers. One approach towards achieving this goal involves the use of shared (or integrated) contacts among devices (e.g., transistors, logic circuits, memories, etc.). For example, in the case of static random access memories (SRAM), shared contacts may be used to connect a gate electrode to a source/drain in complementary metal oxide semiconductors (CMOS) of SRAM cells. A double etching process is used to form the shared contacts. However, this process may allow gate structures (e.g., sidewall spacers) in a double-etched area to be damaged.

SUMMARY

In accordance with one or more embodiments, a semiconductor device incudes a source/drain region in a fin-type active pattern; a gate structure adjacent to the source/drain region; an insulating layer on the source/drain region and the gate structure; a shared contact plug penetrating through the insulating layer, the shared contact plug including a first lower portion connected to the source/drain region, a second lower portion connected to the gate structure, and an upper portion connected to upper surfaces of the first lower portion and the second lower portion; and a plug spacer film between the insulating layer and at least one of the first lower portion and the second lower portion, the plug spacer film including a material different from a material of the insulating layer.

In accordance with one or more other embodiments, a semiconductor device includes a substrate including a first device having a first contact area and a second device having a second contact area; an insulating layer on the substrate and covering the first device and the second device; a shared contact plug penetrating through the insulating layer, the shared contact plug including a first lower portion and a second lower portion connected to the first contact area and the second contact area, respectively, and spaced apart from each other, and an upper portion connected to upper surfaces of the first lower portion and the second lower portion; a plug spacer film surrounding a sidewall of at least one of the first lower portion and the second lower portion and formed of a material different from a material of the insulating layer; and a conductive barrier film between the shared contact plug and the insulating layer to contact with a surface of the shared contact plug.

In accordance with one or more other embodiments, a semiconductor device includes a substrate; a first fin-type active pattern and a second fin-type active pattern, extended on the substrate in a first direction; a first gate structure and a second gate structure extended on the substrate in a second direction different from the first direction, the first gate structure and the second gate structure intersecting the first fin-type active pattern and the second fin-type active pattern, respectively; a first active area on different sides of the first gate structure in the first fin-type active pattern and serving as a first source/drain region; a second active area on different sides of the second gate structure in the second fin-type active pattern and serving as a second source/drain region; an insulating layer on the substrate and covering the first fin-type active pattern, the second fin-type active pattern, the first gate structure, and the second gate structure; a shared contact plug penetrating through the insulating layer, the shared contact plug including a first lower portion and a second lower portion connected to the first active area and the second gate structure, respectively, and a first upper portion connecting upper surfaces of the first lower portion and the second lower portion; and a plug spacer film between at least one of the first lower portion and the second lower portion and the insulating layer and including a material having a selective etching rate with respect to the insulating layer.

In accordance with one or more other embodiments, a semiconductor device includes a first source/drain region and a second source/drain region in a fin-type active pattern; a gate structure between the first source/drain region and the second source/drain region; an insulating layer covering the first source/drain region, the second source/drain region, and the gate structure; a shared contact plug penetrating through the insulating layer, the shared contact plug including a first lower portion and a second lower portion connected to the first source/drain region and the second source/drain region, respectively, a third lower portion on the gate structure, and an upper portion connecting upper surfaces of the first to third lower portions; and a plug spacer film between at least one among the first to third lower portions and the insulating layer, the plug spacer film including a material different from a material of the insulating layer.

In accordance with one or more other embodiments, a semiconductor device includes a substrate; a first fin-type active pattern and a second fin-type active pattern, extended on the substrate in a first direction; a first gate structure and a second gate structure extended on the substrate in a second direction different from the first direction, the first gate structure and the second gate structure intersecting the first fin-type active pattern and the second fin-type active pattern, respectively; a first active area on different sides of the first gate structure in the first fin-type active pattern and serving as a first source/drain region; a second active area on different sides of the second gate structure in the second fin-type active pattern and serving as a second source/drain region; a third gate structure extended in the second direction and between the first active area and the second active area; an insulating layer on the substrate and covering the first fin-type active pattern, the second fin-type active pattern, and the first to third gate structures; a shared contact plug penetrating through the insulating layer, the shared contact plug including a first lower portion and a second lower portion connected to the first active area and the second active area, respectively, a third lower portion on the third gate structure, and an upper portion connecting upper surfaces of the first to third lower portions; and a plug spacer film formed to surround a sidewall of at least one of the first to third lower portions, the plug spacer film including a material having a selective etching rate with respect to a material of the insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
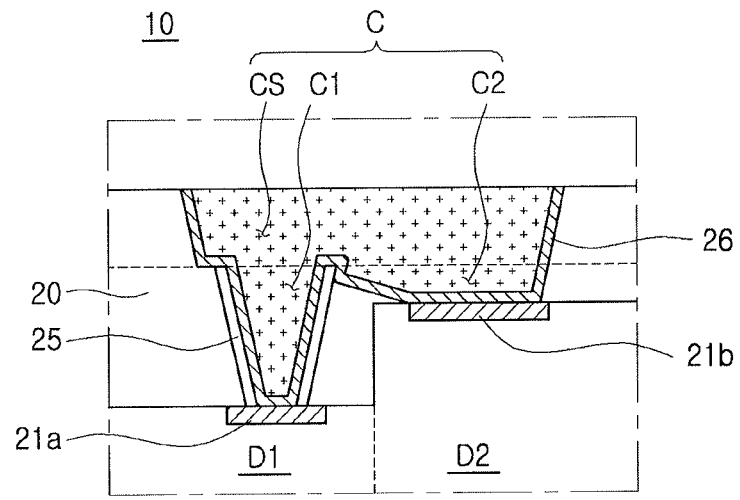
FIG. 1A illustrates an embodiment of a semiconductor device.

FIG. 1A illustrates an embodiment of a semiconductor device 10 which may include a first device D1 having a first contact area 21a and a second device D2 having a second contact area 21b. The semiconductor device 10 may be various semiconductor devices, including but not limited to a logic circuit and a memory. The first device D1 and the second device D2 may be, for example, a transistor or other circuit component.

The first contact area 21a and the second contact area 21b may be on different levels. For example, the first contact area 21a may be on a lower level than the second contact area 21b. In the case of a transistor, the first contact area 21a may be a source/drain region and the second contact area 21b may be a gate (see example embodiments of FIGS. 6 to 9).

The semiconductor device 10 may include an insulating layer 20 encapsulating the first device D1 and the second device D2, and may include a shared contact plug C commonly connected to the first contact area 21a and the second contact area 21b. The shared contact plug C employed in an example embodiment may include a first lower portion C1 and a second lower portion C2 and may include an upper portion CS thereon. The first lower portion C1 and the second lower portion C2 may be spaced apart from each other to be connected to the first contact area 21a and the second contact area 21b, respectively. The upper portion CS may connect surfaces of the first lower portion C1 and the second lower portion C2.

As such, the first lower portion C1, the second lower portion C2, and the upper portion CS may be integrally formed to provide a single shared contact. Etching areas for each contact hole may overlap, thereby preventing overetching caused by a double etching process.

The semiconductor device 10 may further include a plug spacer film 25 formed using a material different from that of the insulating layer 20. The semiconductor device 10 may also include a conductive barrier film 26 between the shared contact plug C and the insulating layer 20. In an example embodiment, the plug spacer film 25 may surround a sidewall of the first lower portion C1. A desired contact hole structure may be formed using the plug spacer film 25.

Figure 1B:
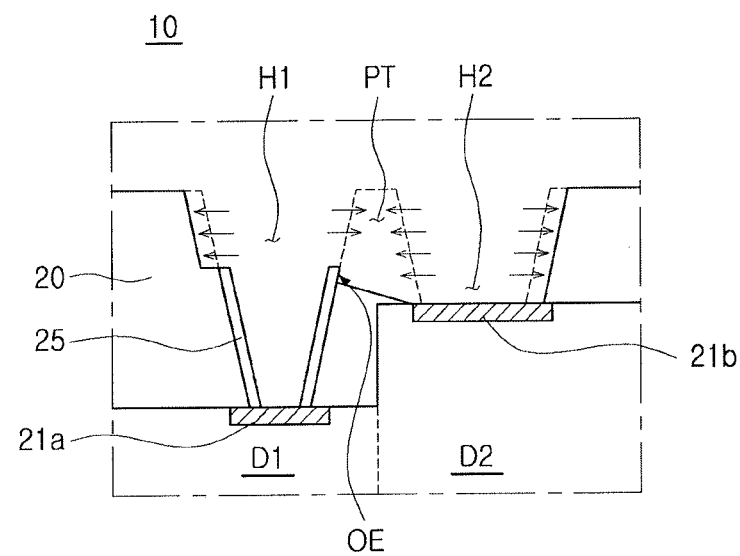
FIG. 1B illustrates an embodiment of a process for forming a contact hole of the semiconductor.

FIG. 1B illustrates an embodiment of a method for forming a contact hole to form the shared contact plug C of FIG. 1A. As illustrated in FIG. 1B, a first contact hole H1 and a second contact hole H2 may be formed to be spaced apart from each other (marked by a dotted line), in order to be connected to the first contact area 21a and the second contact area 21b. Exposed surfaces of the first contact hole H1 and the second contact hole H2 may be etched using a process of enlarging a contact hole (arrow marks). In this process, a bulkhead or a partition PT between the first contact hole H1 and the second contact hole H2 may be removed, thereby providing a space corresponding to the upper portion CS. The process of enlarging a contact hole may be implemented using, for example, a cleaning process before the conductive barrier film 26 is formed, in order to etch the insulating layer 20 or by introducing an additional etching process.

The plug spacer film 25 may include a material having a relatively high selective etching rate with respect to that of the insulating layer 20. For example, the plug spacer film 25 may include a silicon nitride and the insulating layer 20 may include a silicon oxide. Thus, in the process of enlarging a contact hole, the plug spacer film 25 may prevent a lower area (e.g., the first lower portion C1) of the first contact hole H1 from being etched.

An upper end of the plug spacer film 25 may be higher than a second contact area 21b. Spaces corresponding to the first lower portion C1 and the second lower portion C2 may be stably separated by the plug spacer film 25. As illustrated in FIG. 1B, the bulkhead PT may be overetched after the process of enlarging a contact hole, so that an upper portion (OE) of the plug spacer film 25 may be partially exposed.

The first contact hole H1 and the second contact hole H2 may be spaced apart from each other, and then only upper areas of the first contact hole H1 and the second contact hole H2 may be connected using a selective enlarging process using the plug spacer film 25. As a result, a desired shared contact plug C may be formed without a double-etched area.

The contact areas to be shared may be on different levels, and a spacer film may be employed in only one contact hole is described. In another example embodiment, contact areas on the same level may be shared and/or the spacer film may be applied to both contact holes.

Figure 2A:
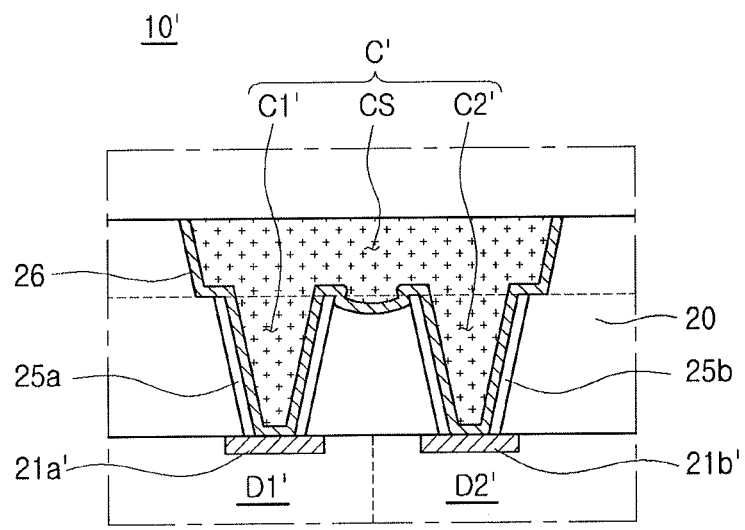
FIG. 2A illustrates another embodiment of a semiconductor device.

FIG. 2A illustrates another embodiment of a semiconductor device 10' which may include a first device D1' having a first contact area 21a' and a second device D2' having a second contact area 21b'. The first contact area 21a' and the second contact area 21b' may be on the same level.

A shared contact plug C' employed in an example embodiment may include a first lower portion C1', a second lower portion C2', and an upper portion CS' thereon. Side surfaces of the first lower portion C1' and the second lower portion C2' may be surrounded by a first plug spacer film 25a and a second plug spacer film 25b. Upper ends of the first plug spacer film 25a and the second plug spacer film 25b may be substantially on the same level. For example, the first plug spacer film 25a and the second plug spacer film 25b may be formed using the same process.

Figure 2B:
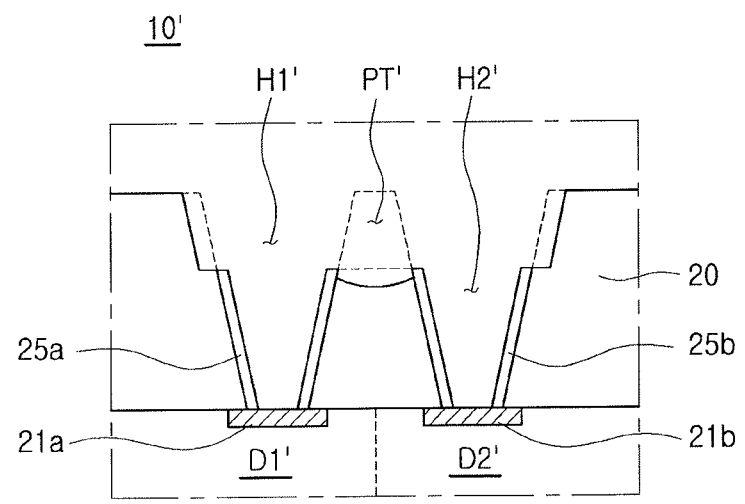
FIG. 2B illustrates an embodiment of a process for forming the contact hole of the semiconductor device of FIG. 2A.

FIG. 2B illustrates an embodiment of a method for forming the shared contact plug C' in FIG. 2A. A single contact hole space may be provided by forming the first contact hole H1' and the second contact hole H2' to be spaced apart from each other. Only upper areas of the first contact hole H1' and the second contact hole H2' are selectively expanded using the first plug spacer film 25a and the second plug spacer film 25b, in order to remove a bulkhead PT'. In a process of removing the bulkhead PT', a portion of an insulating layer 20 over-etched and between the first contact hole H1' and the second contact hole H2' may be lower than the first plug spacer film 25a and the second plug spacer film 25b. In another embodiment, the bulkhead PT' may be removed in a different manner, for example, depending on etching conditions. For example, the portion of an insulating layer 20 between contact holes to be shared may be on a level substantially equal to or higher than that of an upper end of a plug spacer film.

A semiconductor device according to example embodiments may be applied to a device, such as a static random access memory (SRAM).

Figure 3:
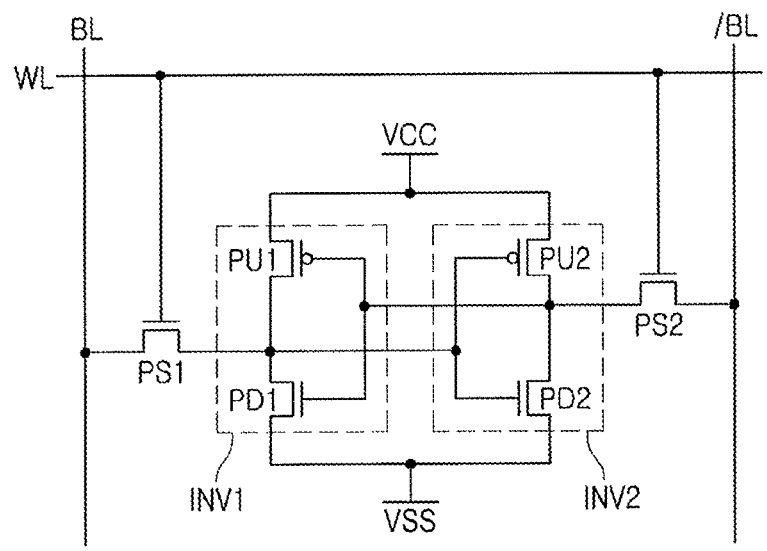
FIGS. 3 and 4 illustrate embodiments of equivalent circuits and layouts of a semiconductor device.
Figure 4:
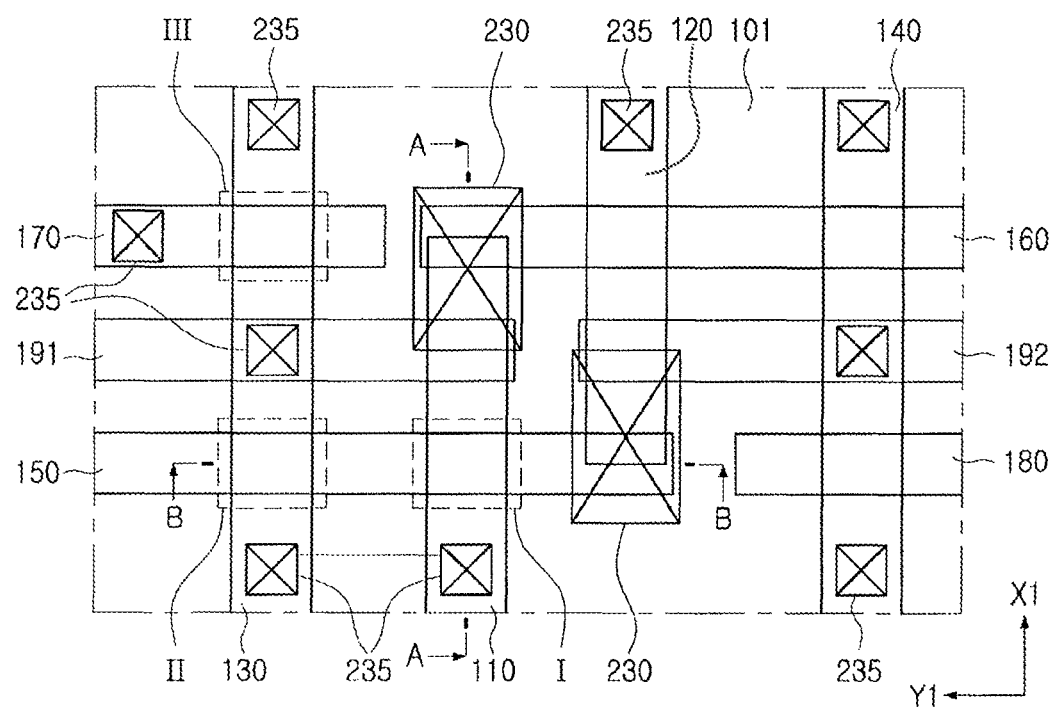

FIG. 3 illustrates an equivalent circuit embodiment of a semiconductor device, and FIG. 4 illustrates a layout embodiment of the semiconductor device in FIG. 3. The semiconductor device may be, for example, a single cell of an SRAM. With reference to FIGS. 3 and 4, a semiconductor device may include a first inverter INV1 and a second inverter INV2, connected in parallel between a power node Vcc and a ground node Vss. The semiconductor device may further include a first pass transistor PS1 and a second pass transistor PS2, connected to output nodes of the first inverter INV1 and a second inverter INV2, respectively.

The first pass transistor PS1 and the second pass transistor PS2 may be connected to a bit line BL and a complementary bit line /BL, respectively. Gates of the first pass transistor PS1 and the second pass transistor PS2 may be connected to a word line WL.

The first inverter INV1 may include a first pull-up transistor PU1 and a first pull-down transistor PD1, connected in series. The second inverter INV2 may include a second pull-up transistor PU2 and a second pull-down transistor PD2, connected in series. The first pull-up transistor PU1 and the second pull-up transistor PU2 may be p-type metal oxide semiconductor (PMOS) transistors, and the first pull-down transistor PD1 and the second pull-down transistor PD2 may be n-type metal oxide semiconductor (NMOS) transistors.

In order to form a single latch circuit, an input node of the first inverter INV1 may be connected to an output node of the second inverter INV2, and an input node of the second inverter INV2 is connected to an output node of the first inverter INV1.

With reference to FIG. 4, a layout corresponding to the equivalent circuit illustrated in FIG. 3 includes a first fin-type active pattern 110, a second fin-type active pattern 120, a third fin-type active pattern 130, and a fourth fin-type active pattern 140 spaced apart from each other, extending in a first direction (e.g., X1 direction in FIG. 4), and provided as an active area of each transistor.

A first gate structure 150, a second gate structure 160, a third gate structure 170, and a fourth gate structure 180 may be extended in a second direction, different from the first direction, e.g., Y1 direction in FIG. 2, substantially perpendicular to the first direction. The first gate structure 150 to the fourth gate structure 180 may intersect the first fin-type active pattern 110 to the fourth fin-type active pattern 140.

The first gate structure 150 may be extended in the second direction to intersect the first fin-type active pattern 110 and the third fin-type active pattern 130 and to overlap an end portion of the second fin-type active pattern 120. The second gate structure 160 may be extended in the second direction to intersect the second fin-type active pattern 120 and the fourth fin-type active pattern 140 and to overlap an end portion of the first fin-type active pattern 110.

The third gate structure 170 and the fourth gate structure 180 may be extended in the second direction to intersect the third fin-type active pattern 130 and the fourth fin-type active pattern 140, respectively. As such, the first fin-type active pattern 110 to the fourth fin-type active pattern 140 may have intersecting portions in which the first fin-type active pattern 110 to the fourth fin-type active pattern 140 intersect the first gate structure 150 to the fourth gate structure 180. An active area provided as a source/drain region may be formed on both (or opposing) sides of each of the intersecting portions to form transistors illustrated in an equivalent circuit of FIG. 3.

Each of the first pull-up transistor PU1 and the second pull-up transistor PU2 may be defined by an area in which the first gate structure 150 and the second gate structure 160 intersect the first fin-type active pattern 110 and the second fin-type active pattern 120 and a periphery thereof.

In addition, each of the first pull-down transistor PD1 and the second pull-down transistor PD2 may be defined by an area in which the first gate structure 150 and the second gate structure 160 intersect the third fin-type active pattern 130 and the fourth fin-type active pattern 140 and a periphery thereof. The first pass transistor PS1 and the second pass transistor PS2 may be defined by an area in which the third gate structure 170 and the fourth gate structure 180 intersect the third fin-type active pattern 130 and the fourth fin-type active pattern 140 and a periphery thereof. A transistor forming an SRAM cell may have structures illustrated in FIGS. 5A to 5C.

Figure 5:
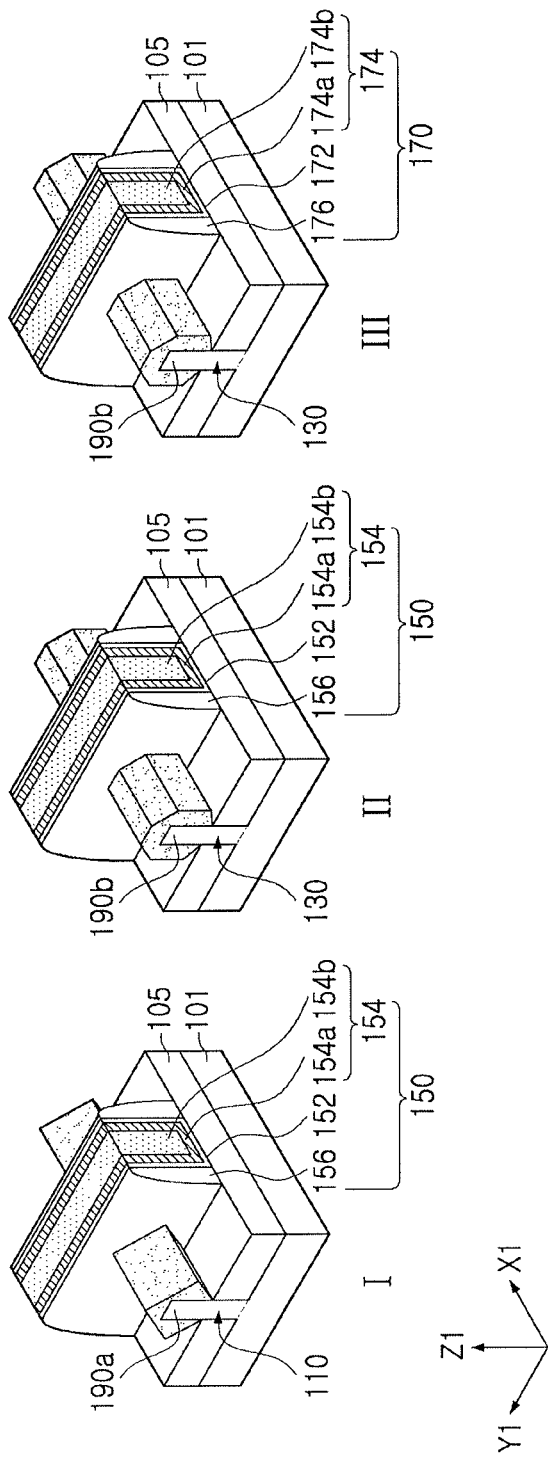
FIGS. 5A to 5C illustrate embodiments of portions I, II, and III in FIG. 4, respectively.
Figure 6:
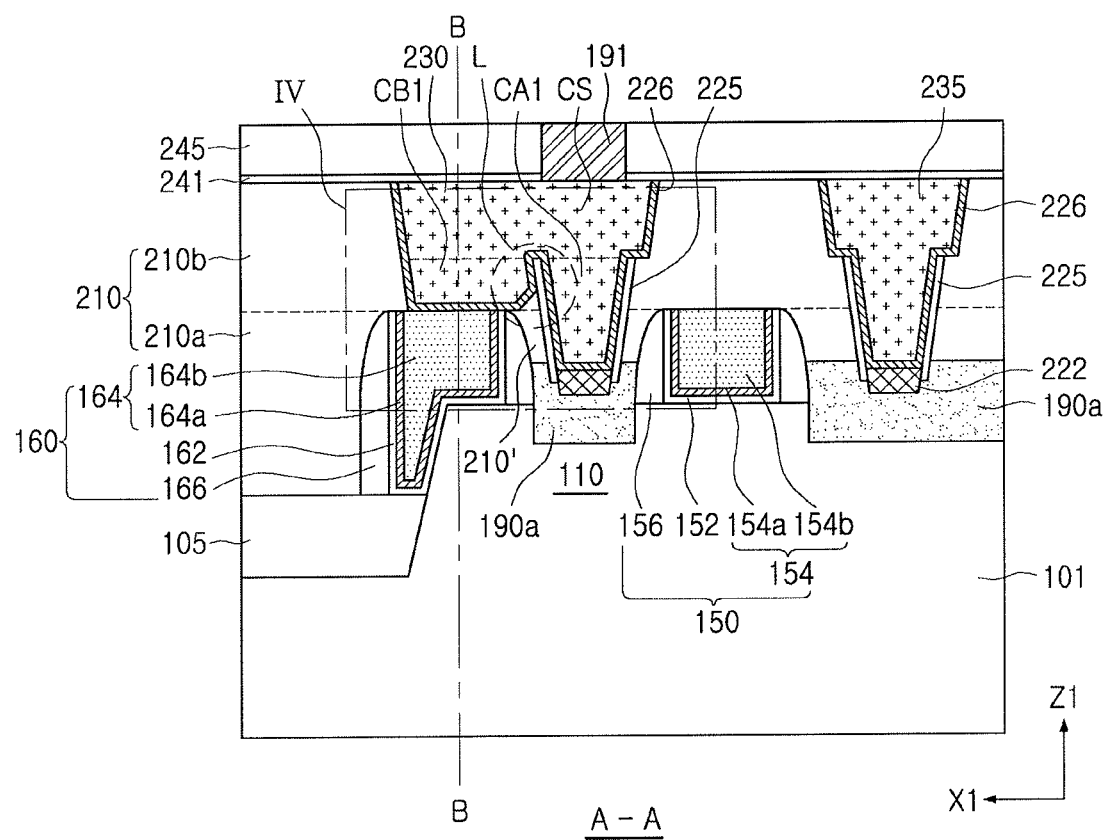
FIGS. 6 and 7 illustrate embodiments taken along lines A-A and B-B in FIG. 4, respectively.
Figure 7:
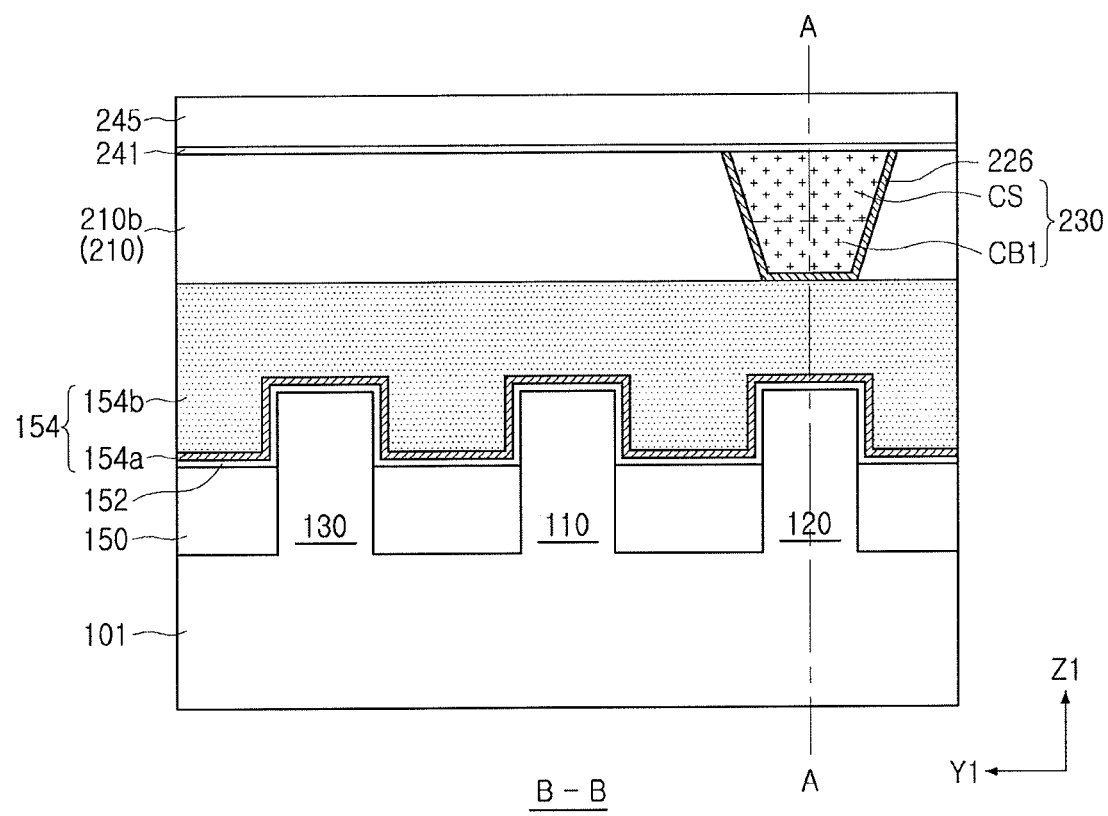

FIGS. 5A to 5C illustrate embodiments of portions I, II, and III of FIG. 4. FIG. 5A illustrates a first pull-up transistor PU1, FIG. 5B illustrates a first pull-down transistor PD1, and FIG. 5C illustrates a first pass transistor PS1. For the sake of convenience of explanation, FIGS. 5A to 5C illustrate only a fin-type active pattern and a gate structure. An interlayer insulating layer 210 and contact plugs 230 and 235 illustrated in FIGS. 6 and 7 are included but not illustrated therein.

With reference to FIG. 5A, the first pull-up transistor PU1 may include a first fin-type active pattern 110 protruding from a substrate 101. The first fin-type active pattern 110 may include an intersecting portion in which the first fin-type active pattern 110 intersects the first gate structure 150 and may include an active area 190a provided as a source/drain region on opposing sides of the intersecting portion.

With reference to FIGS. 5B and 5C, each of the first pull-down transistor PD1 and the first pass transistor PS1 may include a third fin-type active pattern 130 protruding from the substrate 101. The third fin-type active pattern 130 may include intersecting portions in which the third fin-type active pattern 130 intersects the first gate structure 150 and a third gate structure 170 and may include an active area 190b provided as the source/drain region on opposing sides of the intersecting portions. In the third fin-type active pattern 130, a portion between the first gate structure 150 and the third gate structure 170 may be provided as the active area 190b shared by the first pull-down transistor PD1 and the first pass transistor PS1.

The substrate 101 may be formed using, for example, bulk silicon or silicon (Si)-on-insulator (SOI). In one embodiment, the substrate 101 may be provided as a silicon substrate or may include a different material such as but not limited to silicon germanium (SiGe), indium antimonide (InSb), lead telluride (PbTe), indium arsenide (InAs), indium phosphide (InP), gallium arsenide (GaAs), or gallium antimonide (GaSb). In one embodiment, the substrate 101 may be an epitaxial layer on a base substrate.

As illustrated in FIGS. 5A to 5C, a field insulating layer 105 may encapsulate a portion of a sidewall of each of the first fin-type active pattern 110 and the third fin-type active pattern 130. Thus, at least a portion of an upper surface of the first fin-type active pattern 110 and at least a portion of an upper surface of the third fin-type active pattern 130 may protrude beyond an upper surface of the field insulating layer 105. As described in FIG. 4, the first fin-type active pattern 110 and the third fin-type active pattern 130 are exposed from the field insulating layer 105 and may be extended in a first direction (an X1 direction). The field insulating layer 105 may include, for example, an oxide film, a nitride film, an oxynitride film, or combinations thereof.

The first fin-type active pattern 110 and the third fin-type active pattern 130 may be provided as a portion of the substrate 101 or may include an epitaxial layer grown from the substrate 101. In an example, the first fin-type active pattern 110 and the third fin-type active pattern 130 may include silicon (Si) or germanium (Ge), or another semiconductor material. In another example, the first fin-type active pattern 110 and the third fin-type active pattern 130 may include a compound semiconductor, for example, a Group IV-IV compound semiconductor or a Group III-V compound semiconductor. In the case of a Group IV-IV compound semiconductor, the first fin-type active pattern 110 and the third fin-type active pattern 130 may be provided as a binary compound and a ternary compound, including at least two of carbon (C), Si, Ge, and tin (Sn), or a compound in which the binary compound and the ternary compound are doped with a Group IV element.

In an example embodiment, the first pull-up transistor PU1 and a second pull-up transistor PU2 may be p-type metal oxide semiconductor FETs (MOSFETs). The first pull-down transistor PD1, the second pull-down transistor PD2, the first pass transistor PS1, and a second pass transistor PS2 may be n-type MOSFETs. In the substrate 101, the first fin-type active pattern 110 and a second fin-type active pattern 120 may be provided as a p-type area. The third fin-type active pattern 130 and a fourth fin-type active pattern 140 may be provided as an n-type area.

The active areas 190a and 190b may be obtained in such a manner that, in the first fin-type active pattern 110 and the third fin-type active pattern 130, opposing sides of the first gate structure 150 and the third gate structure 170 are recessed to be relatively low, and an epitaxial layer is regrown. The active areas 190a and 190b may be source/drain regions and may include a raised source/drain (RSD) with an upper surface on a higher level than upper surfaces of the first fin-type active pattern 110 and the third fin-type active pattern 130. A cross section of the active area 190a of the first pull-up transistor PU1 illustrated in FIG. 5A may have, for example, a pentagonal shape or another shape. The cross section of the active area 190b of the first pull-down transistor PD1 and the first pass transistor PS1 illustrated in FIGS. 5B and 5C may have, for example, a hexagonal shape, a polygonal shape with relatively wide angles, or another shape.

The active area 190a of the first pull-up transistor PU1 may be formed in such a manner that an SiGe epitaxial layer having a relatively high lattice constant is regrown. In an SiGe layer having been selectively epitaxially grown, a Ge content may vary depending on a growth direction. The active area 190b of the first pull-down transistor PD1 and the first pass transistor PS1, illustrated in FIGS. 5B and 5C, may be formed in such a manner that Si or an silicon carbide (SiC) epitaxial layer having a relatively low lattice constant is regrown.

With reference to FIGS. 5A to 5C, the first gate structure 150 may be provided as a gate of the first pull-up transistor PU1 and the first pull-down transistor PD1. The third gate structure 170 may be provided as a gate of the first pass transistor PS1.

The first gate structure 150 may include a gate insulating layer 152, a gate electrode 154, and a sidewall spacer 156, while the third gate structure 170 may include a gate insulating layer 172, a gate electrode 174, and a sidewall spacer 176.

The first pull-up transistor PU1, the first pull-down transistor PD1, and the first pass transistor PS1 may include the gate insulating layers 152 and 172. The gate insulating layer 152 may be between the first fin-type active pattern 110 and the gate electrode 154, and may be formed along an upper surface and a sidewall of the first fin-type active pattern 110. The gate insulating layer 172 may be between the third fin-type active pattern 130 and the gate electrode 174 and may be formed along an upper surface and a sidewall of the third fin-type active pattern 130.

A gate insulating layer 152 of the first pull-up transistor PU1 and the first pull-down transistor PD1 may be connected along the first gate structure 150. A gate insulating layer 172 of the third gate structure 170 may be formed using a material different from that of the gate insulating layer 152 of the first gate structure 150.

Each of the gate insulating layers 152 and 172 may include a high-k dielectric material having a dielectric constant higher than a silicon oxide film. For example, each of the gate insulating layers 152 and 172 may include one or more of hafnium oxide, a hafnium silicon oxide, a lanthanum oxide, a lanthanum aluminum oxide, a zirconium oxide, a zirconium silicon oxide, a tantalum oxide, a titanium oxide, a barium strontium titanium oxide, a barium titanium oxide, a strontium titanium oxide, a yttrium oxide, an aluminum oxide, a lead scandium tantalum oxide, and a lead zinc niobate.

A gate electrode 154 forming each of the first pull-up transistor PU1, the first pull-down transistor PD1, and the first pass transistor PS1 may include a first metal layer 154a to control a work function and a second metal layer 154b filling a space. A gate electrode 174 forming each of the first pull-up transistor PU1, the first pull-down transistor PD1, and the first pass transistor PS1 may include a first metal layer 174a to control a work function and a second metal layer 174b filling a space. In an example embodiment, the gate electrodes 154 and 174 are illustrated as having a two-layer structure, but may have another multi-layer structure in another embodiment, e.g., gate electrodes 154 and 174 may be formed using a metal layer having a two-layer or higher structure.

A gate electrode 154 of the first pull-up transistor PU1 and the first pull-down transistor PD1 may be formed to be connected along the first gate structure 150. The gate electrode 174 of the third gate structure 170 may be formed using a material different from that of the gate electrode 154 of the first gate structure 150. For example, each of first metal layers 154a and 174a may include at least one of titanium nitride (TiN), tantalum nitride (TaN), titanium carbide (TiC), and tantalum carbide (TaC). Each of second metal layers 154b and 174b may include tungsten (W) or aluminum (Al). In another example, each of the gate electrodes 154 and 174 may be formed using Si, SiGe, or another material which is not a metal. The gate electrodes 154 and 174 may be formed using, for example, a replacement process or another process.

The first pull-up transistor PU1, the first pull-down transistor PD1, and the first pass transistor PS1 may include the sidewall spacers 156 and 176. Each of the sidewall spacers 156 and 176 may be formed on a sidewall of the gate electrodes 154 and 174. For example, the sidewall spacers 156 and 176 may include at least one among SiN, SiON, SiO$_2$, SiOCN, and combinations thereof. The sidewall spacers 156 and 176 are illustrated as having a single layer structure, but may have a multilayer structure in another embodiment.

In a manner similar to a case described above, the second fin-type active pattern 120 may intersect the second gate structure 160 and may include an active area provided as a source/drain region on opposing sides of the second gate structure 160. Thus, the second pull-up transistor PU2 may be defined by an area in which the second gate structure 160 intersects the second fin-type active pattern 120 and a periphery thereof.

The fourth fin-type active pattern 140 may intersect each of the second gate structure 160 and the fourth gate structure 180 and may include active areas provided as a source/drain region on opposing sides thereof. Thus, the second pull-down transistor PD2 may be defined by an area in which the second gate structure 160 intersects the fourth fin-type active pattern 140 and a periphery thereof. The second pass transistor PS2 may be defined by an area in which the fourth gate structure 180 intersects the fourth fin-type active pattern 140 and a periphery thereof.

The second pull-up transistor PU2, the second pull-down transistor PD2, the second pass transistor PS2 may correspond to the first pull-up transistor PU1, the first pull-down transistor PD1, and the first pass transistor PS1, respectively, and may be understood with reference to descriptions of FIGS. 5A to 5C.

A first wiring 191 may be formed to connect the first fin-type active pattern 110 to the third fin-type active pattern 130 between the first gate structure 150 and the third gate structure 170. In a manner similar to a case described above, a second wiring 192 may be formed to connect the second fin-type active pattern 120 to the fourth fin-type active pattern 140 between the second gate structure 160 and fourth gate structure 180.

As illustrated in FIG. 4, a plurality of contacts (230 and 235, hereinafter referred to as a contact plug) may be formed to connect devices. A shared contact 230 may be included between contacts 235. According to an example embodiment, an SRAM cell may include two shared contacts 230. Each of the two shared contacts 230 may be on a periphery of an end portion of the first fin-type active pattern 110 and the second fin-type active pattern 120 in which the first gate structure 150 intersects the second gate structure 160 and may simultaneously connect the first wiring 191 and the second wiring 192 together with an active area (that is, a source/drain region) of the first fin-type active pattern 110 and the second fin-type active pattern 120 and first and second gate structures 150 and 160.

A shared contact 230 employed in an example embodiment will be described in detail with reference to FIGS. 6 to 8.

FIGS. 6 and 7 illustrate cross-sectional embodiments taken along lines A-A and B-B in FIG. 4, respectively. Features having the same number may be understood with reference to the features in FIGS. 5A to 5C.

With reference to FIG. 6, a first gate structure 150 and a second gate structure 160 may intersect different portions of a first fin-type active pattern 110. The first gate structure 150, the first fin-type active pattern 110 intersecting the first gate structure 150, and an active area 190a on opposing sides of the first fin-type active pattern 110 may be formed using a first pull-up transistor PU1 (see FIG. 4).

A second gate structure 160 of a different transistor (e.g., a second pull-up transistor and/or a second pull-down transistor) may be extended to an area adjacent to the active area 190a (that is, a source/drain region) of the first pull-up transistor PU1. In an example embodiment, the second gate structure 160 may be extended to an end portion of a second fin-type active pattern 120. As illustrated in FIG. 4, the first gate structure 150 may be extended by intersecting a third fin-type active pattern 130, the first fin-type active pattern 110, and the second fin-type active pattern 120.

With reference to FIGS. 6 and 7, an insulating layer 210 may include an intergate insulating layer 210a between the first gate structure 150 and the second gate structure 160, and may include an interlayer insulating layer 210b on the first gate structure 150, the second gate structure 160, and the intergate insulating layer 210a. In detail, the intergate insulating layer 210a and the interlayer insulating layer 210b are not limited thereto and may include, for example, a silicon oxide film. In example embodiments, at least one of the intergate insulating layer 210a and the interlayer insulating layer 210b may be formed using a tetra ethyl ortho silicate (TEOS) film. In other example embodiments, at least one of the intergate insulating layer 210a and the interlayer insulating layer 210b may be provided as a ultra low K (ULK) film having a ultra low dielectric constant (e.g., about 2.2 to about 2.4), for example, a film selected from an SiOC film or an SiCOH film.

As illustrated in FIG. 6, contact plugs 230 and 235 may include a first contact plug 235 and a shared (second) contact plug 230.

The first contact plug 235 may be extended from an interior of a recess of the active area 190a in a third direction (e.g., a Z direction) perpendicular to an upper surface (e.g., an X-Y plane) of a substrate 101. A cross section of the first contact plug 235 may be circular, oval, polygonal, or another shape, based on the X-Y plane.

The shared contact plug 230 may be formed to be commonly connected to the active area 190a providing a source/drain region of the first pull-up transistor PU1 and to a second gate electrode 164 of a different transistor. In a manner similar to the first contact plug 235, the shared contact plug 230 may be formed to penetrate through the insulating layer 210 in the third direction (Z direction) substantially perpendicular to the upper surface of the substrate 101.

The contact plugs 230 and 235 may be formed, for example, using tungsten (W), copper (Cu), Al, alloys thereof, or combinations thereof. The active area 190a may have a recess, and the contact plugs 230 and 235 are connected to the active area 190a and to the recess of the active area 190a. A metal silicide layer 222 may be formed in the recess, thereby guaranteeing relatively low contact resistance between the active area 190a and the contact plugs 230 and 235. The metal silicide layer 222 may be between the active area 190a and the contact plugs 230 and 235 (or a conductive barrier film 226).

The metal silicide layer 222 may be formed in such a manner that a metal layer reacts with a semiconductor material (e.g., Si, SiGe, Ge, or the like) of the active area 190a provided as a source/drain region. In an example embodiment, the metal silicide layer 222 may have an empirical formula expressed, for example, by $MSi_xD_y$, where M is a metal, D is an element having a component different from those of M, and Si, $0<x\leq3$, and $0\leq y\leq1$. The metal M may be, for example, titanium (Ti), cobalt (Co), nickel (Ni), tantalum (Ta), platinum (Pt), or combinations thereof. Element D may be, for example, Ge, C, argon (Ar), krypton (Kr), xenon (Xe), or combinations thereof. The metal silicide layer 222 may be, for example, titanium silicide.

In an example embodiment, bottom surfaces and sidewalls of the contact plugs 230 and 235 may be surrounded by the conductive barrier film 226. The conductive barrier film 226 may be formed using, for example, a conductive metal nitride layer. The conductive barrier film 226 may be formed using TiN, TaN, aluminum nitride (AlN), tungsten nitride (WN), or combinations thereof, or another material.

The shared contact plug 230 employed in an example embodiment may be divided into first and second lower portions CA1 and CB1 and an upper portion CS. The first lower portion CA1 may be connected to the active area 190a which is provided as a source/drain region. The second lower portion CB1 may be connected to a gate electrode of the second gate structure 160. The upper portion CS may be connected to each of upper surfaces of the first lower portion CA1 and the second lower portion CB1.

A plug spacer film 225 may surround the first lower portion CA1. The plug spacer film 225 may also be formed on a sidewall of the first contact plug 235 in a manner similar to a case described above. The plug spacer film 225 may be between the first lower portion CA1 and the insulating layer 210 and may be formed using a material different from that of the insulating layer 210. The plug spacer film 225 may be formed using a material having a selective etching rate with respect to the insulating layer 210. The plug spacer film 225 may include, for example, a silicon nitride. The insulating layer 210 may include, for example, a silicon oxide.

In the shared contact plug 230 according to an example embodiment, the first and second lower portions CA1 and CB1 and the upper portion CS may be divided based on a level of an upper end of the plug spacer film 225. The shared contact plug 230 may be obtained in such a manner that a contact hole of the first lower portion CA1 and the second lower portion CB1 is divided after it is formed. The contact hole may be selectively expanded so that only upper areas of two divided contact holes are connected (e.g., see FIGS. 14 and 15).

As illustrated in an example embodiment, the second gate structure 160 may include an extended area (e.g., a contact area) extended to be adjacent to the source/drain region (the active area 190a) of a different transistor PU1. The second lower portion CB1 may be connected to the extended area of the second gate structure 160. As illustrated in FIG. 6, the first lower portion CA1 may be adjacent to a sidewall spacer 166 of the second gate structure 160.

Figure 8:
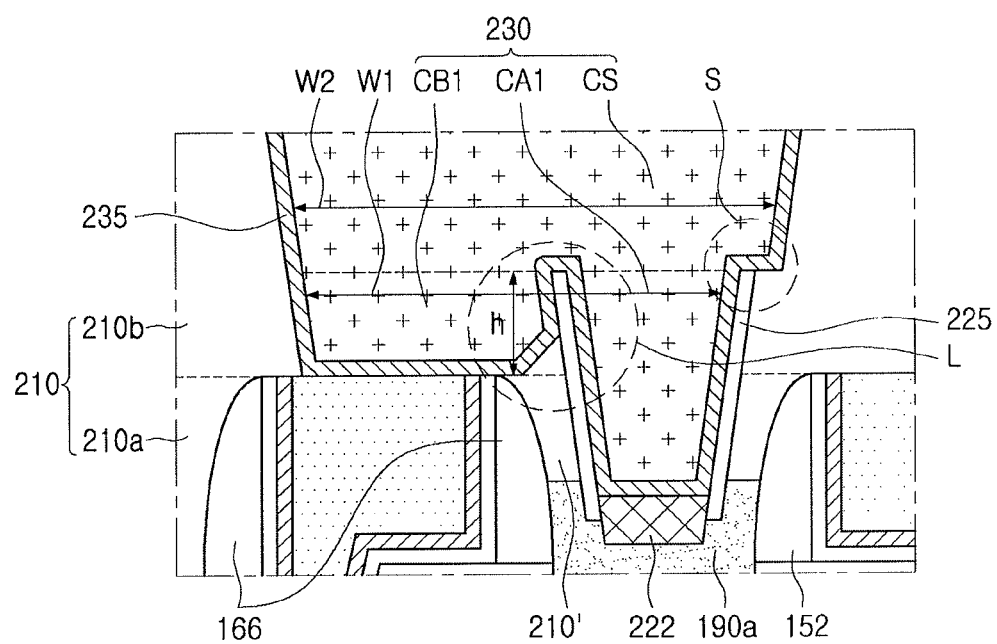
FIG. 8 illustrates an embodiment of a portion IV in FIG. 6.

FIG. 8 illustrates an enlarged cross-sectional view of an embodiment of portion IV of FIG. 6, that is, the shared contact plug 230. As illustrated in FIG. 8, a step S may be present between a side surface of the first lower portion CA1 and a side surface of the upper portion CS. In the case of the step S, in the 'selective enlarging process' described above, a profile of the first lower portion CA1 is maintained by the plug spacer film 225, while an upper area thereof may be formed using additional etching.

As illustrated in FIGS. 6 and 8, in a cross section taken in a direction in which the first lower portion CA1 and the second lower portion CB1 are arrayed, a width W2 of the upper portion CS may be greater than a maximum value of a width W1 of an exterior defined as the first lower portion CA1 and the second lower portion CB1.

The upper end of the plug spacer film 225 may be at a level higher than an upper surface of the second gate structure 160. A difference h in levels between the upper end of the plug spacer film 225 and the upper surface of the second gate structure 160 may be at least 10 nm. The difference h in levels therebetween may be, for example, in a range of 10 nm to 30 nm.

The first lower portion CA1 and the second lower portion CB1 may be easily divided in such a manner that the plug spacer film 225 is disposed between them. In addition, a portion of the insulating layer 210 may remain below the upper portion CS. Since, in a structure thereof, a double-etched area is effectively not present, damage to the sidewall spacer 166 due to overetching may be reduced or prevented.

As illustrated in FIG. 8, the insulating layer 210 may include a residual portion 210' of an insulating layer between the first lower portion CA1 and the second lower portion CB1 below the upper portion CS. The residual portion 210' of an insulating layer may protect the sidewall spacer 166 so as not to be damaged in a process of forming a contact hole.

As described above, in an example embodiment, in a process of enlarging the contact hole (that is, when the contact hole is selectively enlarged (e.g., cleaning before a barrier layer is formed)), the second lower portion CB1 may be enlarged to be connected to an area of the plug spacer film 225.

As illustrated in FIG. 8, a main area of the residual portion 210' of an insulating layer 210 may be between the second gate structure 160 and the first lower portion CA1.

With reference to FIGS. 6 and 8, a low dielectric layer 245 may be formed on the insulating layer 210, and a wiring 191 may be formed in the low dielectric layer 245. For example, the low dielectric layer 245 may be a silicon oxide film, a silicon oxynitride film, an SiOC film, an SiCOH film, or combinations thereof. The wiring 191 may be formed using a damascene process and may include, for example, Cu or a Cu alloy. As illustrated in an example embodiment, an etching stop layer 241 may be between the insulating layer 210 and the low dielectric layer 245. The etching stop layer 241 may not only play a role in stopping etching, but may also prevent a metal (e.g., Cu) forming the wiring 191 from being diffused to an area therebelow. The etching stop layer 241 may include AN or another material.

In the case of the shared contact plug 230 employed in an example embodiment, only a shared contact plug disposed on the first fin-type active pattern 110 was described. However, as illustrated in FIGS. 1 and 2, since a single SRAM cell is designed to be included in two shared contact plugs, an additional shared contact plug disposed in the second fin-type active pattern 120 may be formed in a manner similar to a case described above.

In addition, the additional shared contact plug may be formed in a direction substantially perpendicular to the upper surface of the substrate 101, in order to penetrate through the insulating layer 210 in a manner similar to an example embodiment described above. The additional shared contact plug may include a first lower portion and a second lower portion, connected to a source/drain region of the second fin-type active pattern 120 and the first gate structure 150, respectively, and may include a first upper portion connected to each of upper surfaces of the first lower portion and the second lower portion.

Figure 9:
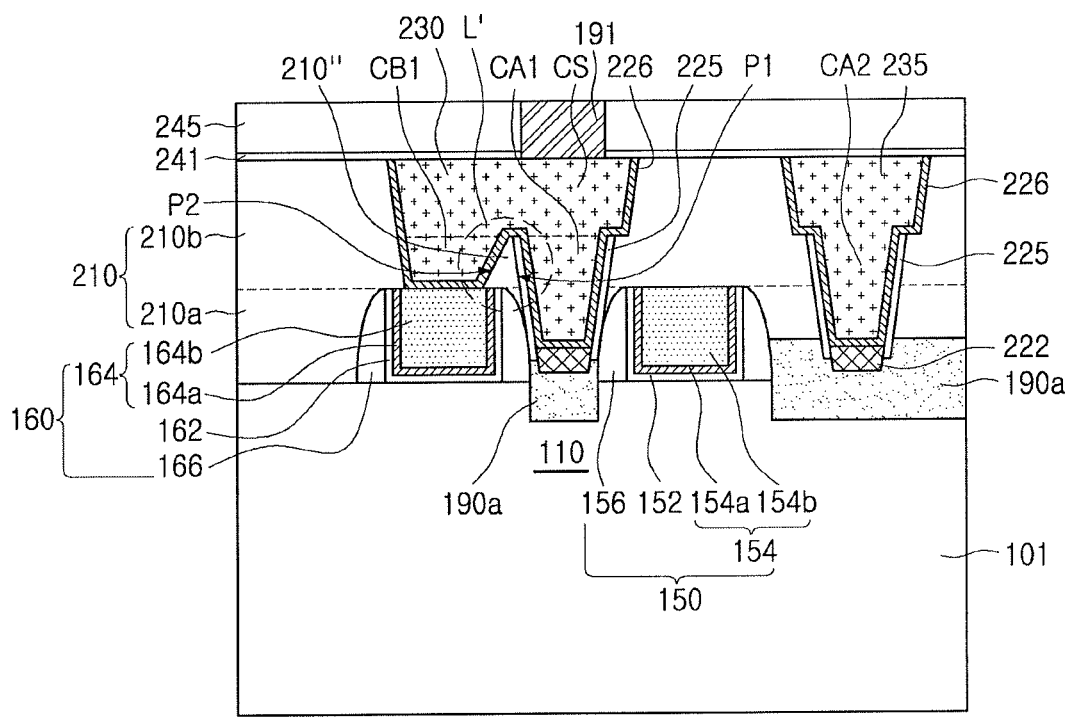
FIG. 9 illustrates another embodiment of a semiconductor device.

FIG. 9 illustrates another embodiment of a semiconductor device which may be similar to the embodiment of FIG. 6, except for a residual portion 210" of an insulating layer and a position in which a second gate structure 160 intersects a first fin-type active pattern 110.

In an example embodiment, since a first gate structure 150 and the second gate structure 160 may have a relatively narrow interval, a first lower portion CA1 of a shared contact plug 230 may be formed to be substantially connected to sidewall spacers 156 and 166 of the first gate structure 150 and the second gate structure 160. Thus, an insulating layer 210 may substantially not be present between the second gate structure 160 and the first lower portion CA1. In addition, in a manner different from an example embodiment described above, in an example embodiment, the residual portion 210" of an insulating layer between the first lower portion CA1 and the second lower portion CB1 may be less etched to remain in an upper portion of a sidewall spacer 166.

As illustrated in FIG. 9, the residual portion 210" of an insulating layer 210 may have an asymmetrical structure. In a cross section taken in a direction in which the first lower portion CA1 and the second lower portion CB1 are arrayed, a sidewall P1 in contact with the first lower portion CA1 and a sidewall P2 in contact with the second lower portion CB1 have an asymmetrical structure.

As illustrated above, when a contact hole is selectively enlarged, the sidewall P2 of the second lower portion CB1 is damaged, while the sidewall P1 in contact with the first lower portion CA1 is protected by the plug spacer film 225. Thus, the sidewall P2 in contact with the second lower portion CB1 may have a gentler slope than that of the sidewall P1 of the first lower portion CA1. As such, the residual portion 210" of an insulating layer 210 may have various forms depending on a condition of a process of enlarging a contact hole.

In addition, in the same manner as an example embodiment described above, the second gate structure 160 may not intersect an end portion of the first fin-type active pattern 110. As illustrated in FIG. 9, the second gate structure 160 may be extended to intersect a different portion disposed adjacent to a source/drain region in which a contact will be shared.

Figure 10:
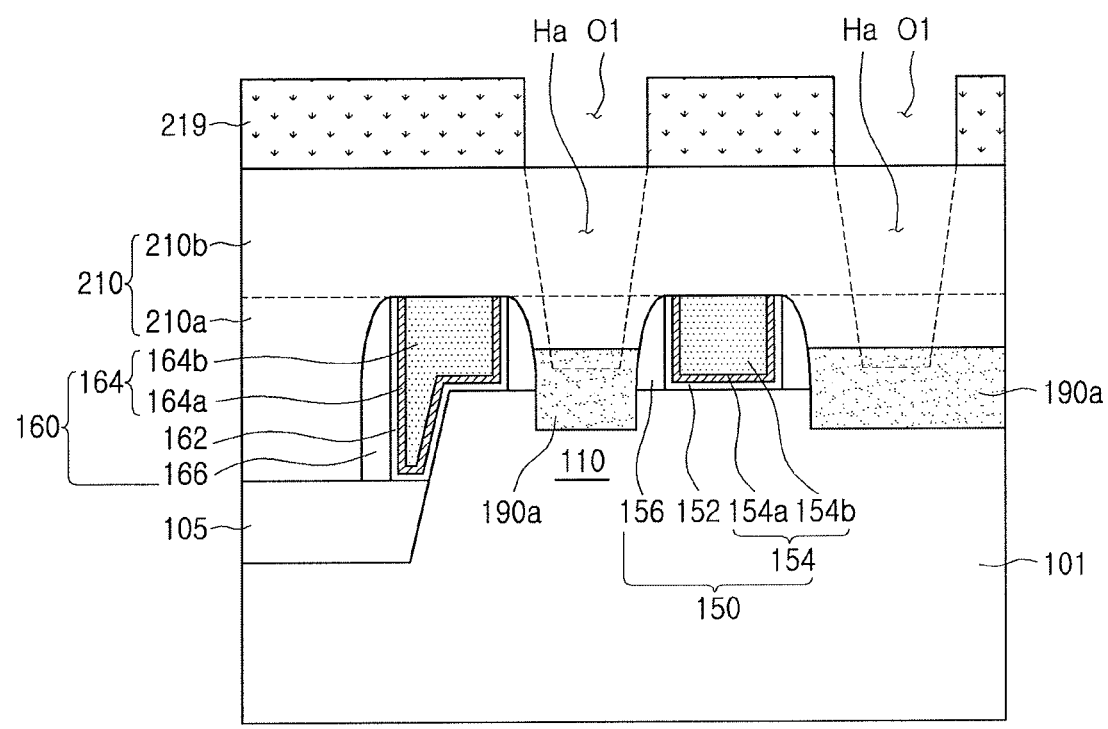
FIGS. 10 to 19 illustrate stages in an embodiment of a method for manufacturing a semiconductor device.

FIGS. 10 to 19 illustrate stages of an embodiment of a method for manufacturing a semiconductor device. With reference to FIG. 10, a first mask 219 including a first opening O1 may be formed on an insulating layer 210. The first mask 219 may be formed using, for example, a spin-on hardmask (SOH). The first opening O1 may be defined as a first contact hole Ha to provide an active area, a source/drain region. A desired first contact hole Ha is marked by a dotted line in FIG. 10.

Figure 11:
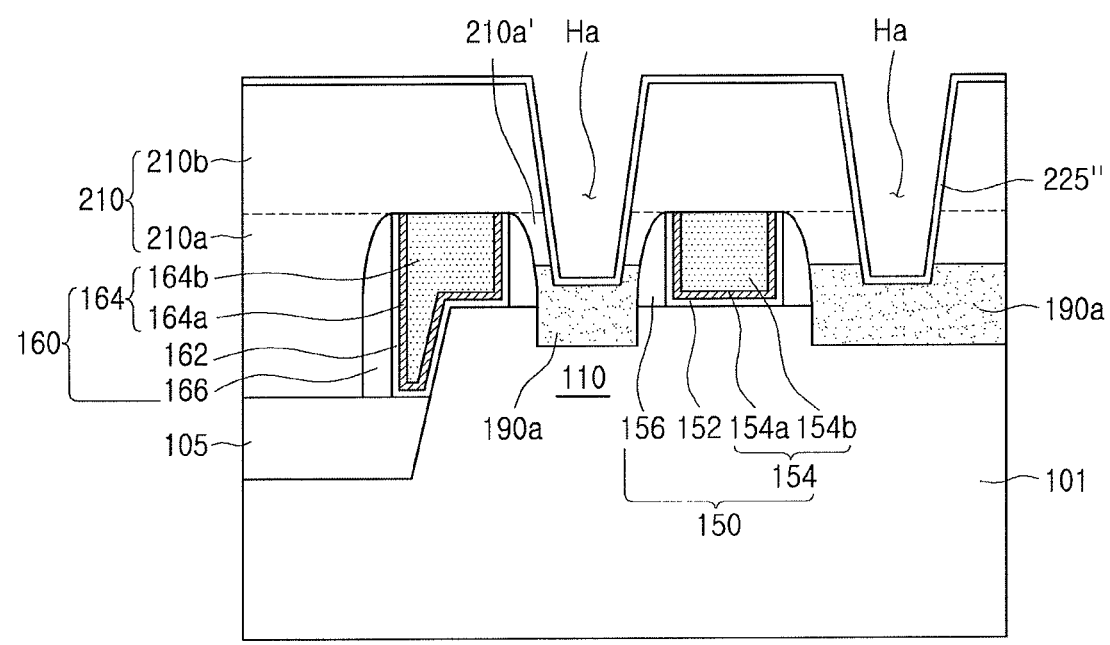

With reference to FIG. 11, the first contact hole Ha may be formed using an etching process using the first mask 219, and a material layer 225" for a plug spacer film may be formed. The first contact hole Ha may include a recess having a specific depth in an active area 190a. A portion 210a' of an insulating layer may remain between the first contact hole Ha and a second gate structure 160. The material layer 225" may be deposited on an entirety of a surface of the insulating layer 210 including the first contact hole Ha formed therein. The insulating layer 210 may include, for example, a silicon oxide. The material layer 225" may include, for example, a silicon nitride.

Figure 12:
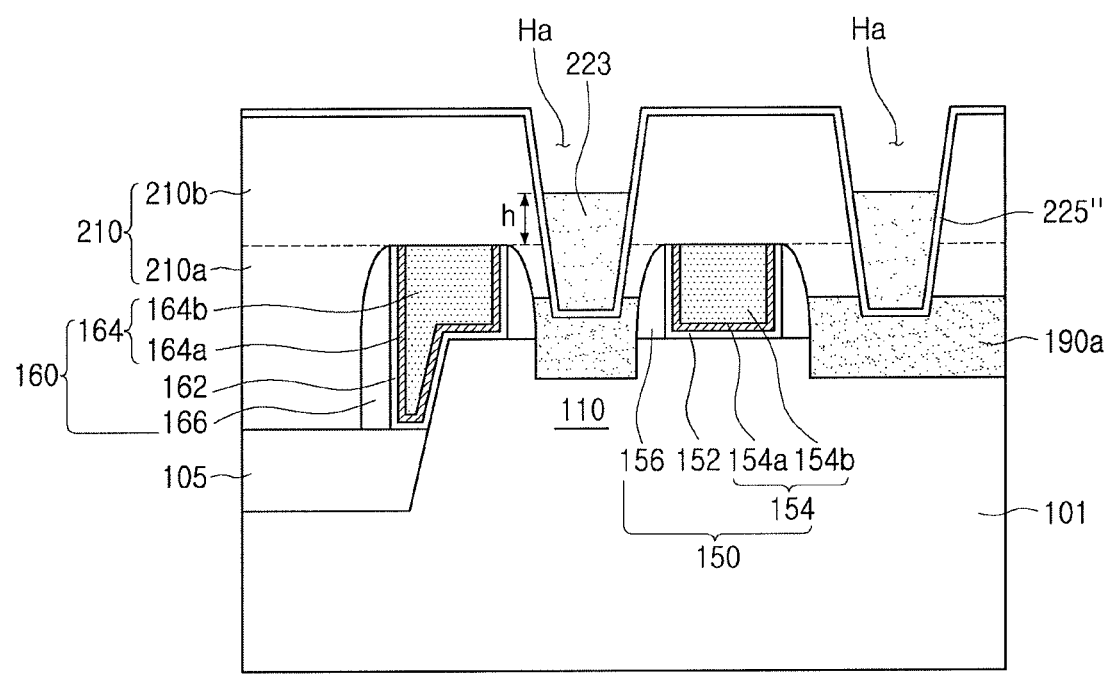

Subsequently, as illustrated in FIG. 12, in order to perform a first patterning process on the material layer 225", a mask material (e.g., SOH) may be deposited on an entirety of a surface thereof to be etch backed, so that a filled mask pattern 223 may be formed by allowing the mask material to partially remain in the first contact hole Ha. In a process described above, only a portion of a material layer on an upper surface of the insulating layer 210 and in an upper area of the first contact hole Ha may be exposed.

In this case, an upper surface of the filled mask pattern 223 may be defined as a height of an upper end of a plug spacer film to be formed in a subsequent process. The upper surface of the filled mask pattern 223 may be higher than at least an upper surface of the second gate structure 160. The difference h between two levels may be within a predetermined range, for example, 10 nm or higher.

Figure 13:
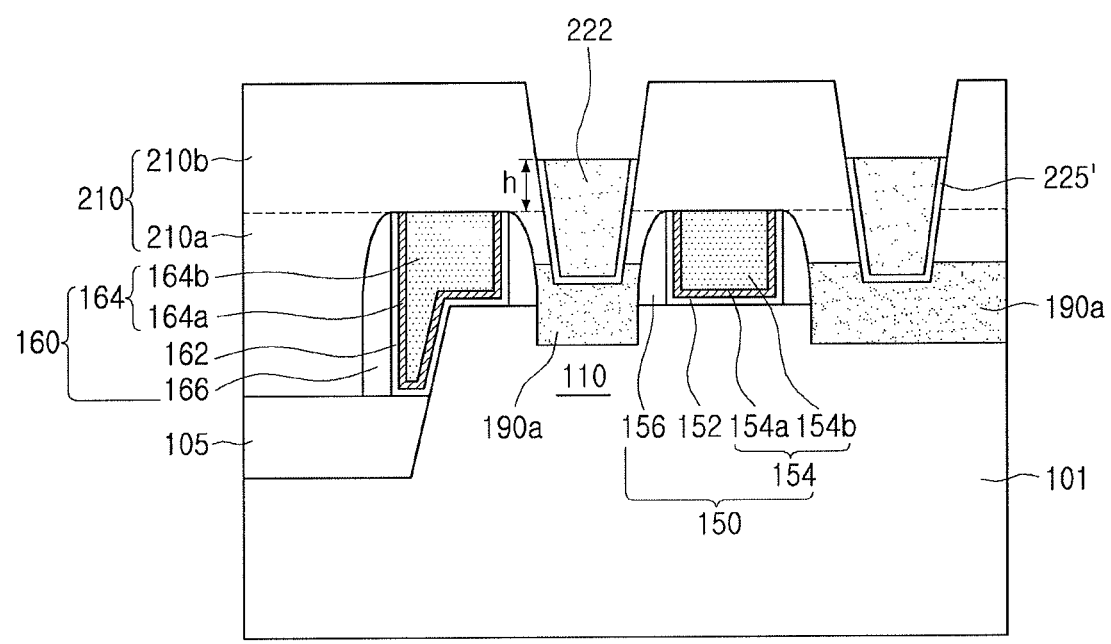

An exposed portion of the material layer 225" may be removed using the filled mask pattern 223, to thereby obtain a plug spacer film 225' having a predetermined height of an upper end thereof, for example, as illustrated in FIG. 13.

Figure 14:
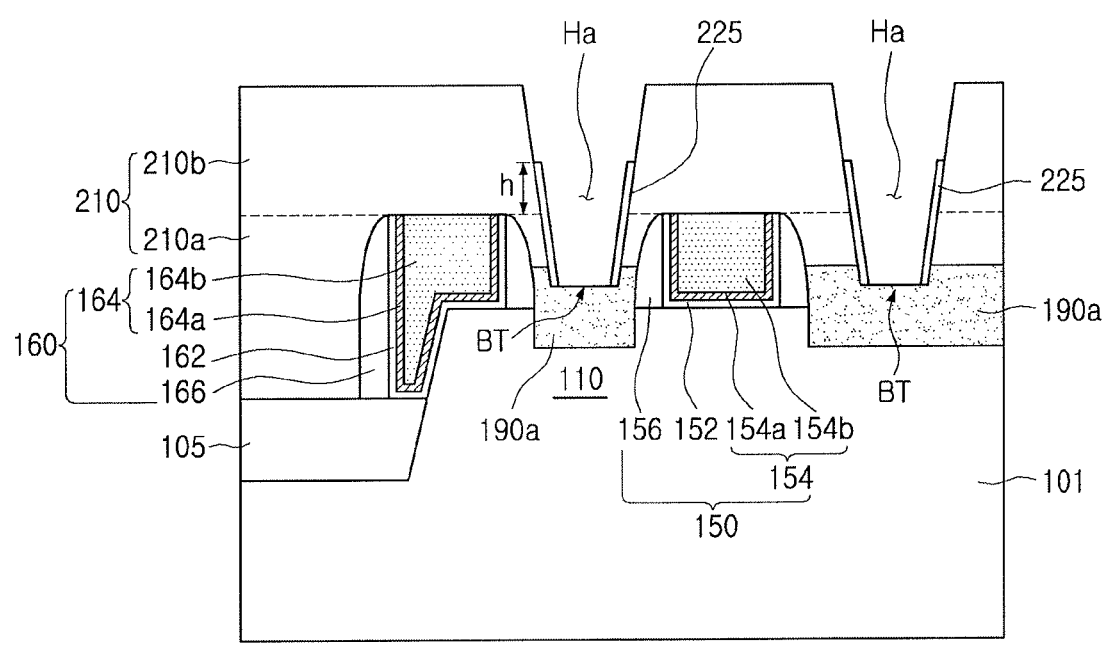

Subsequently, as illustrated in FIG. 14, the filled mask pattern 223 in the first contact hole Ha may be removed. Then, a portion of a spacer on a bottom surface BT of the first contact hole Ha may be selectively removed. Using a process described above, a plug spacer film 225 with predetermined characteristics may be formed on an internal sidewall of the first contact hole Ha.

Figure 15:
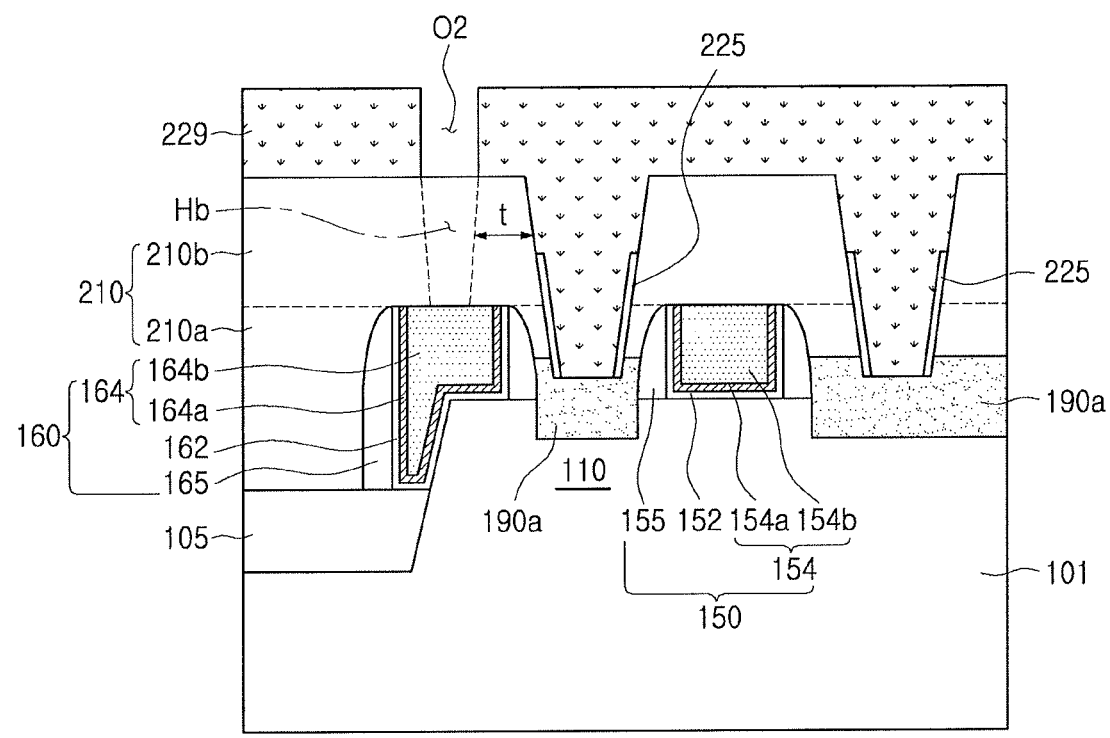

Subsequently, as illustrated in FIG. 15, a second mask 229 including a second opening O2 may be formed on the insulating layer 210. The second mask 229 may be formed using, for example, SOH in a manner similar to the first mask 219. The second opening O2 may be defined as a second contact hole Hb for a gate electrode 164. A desired second contact hole Hb is marked by a dotted line in FIG. 15.

Figure 16:
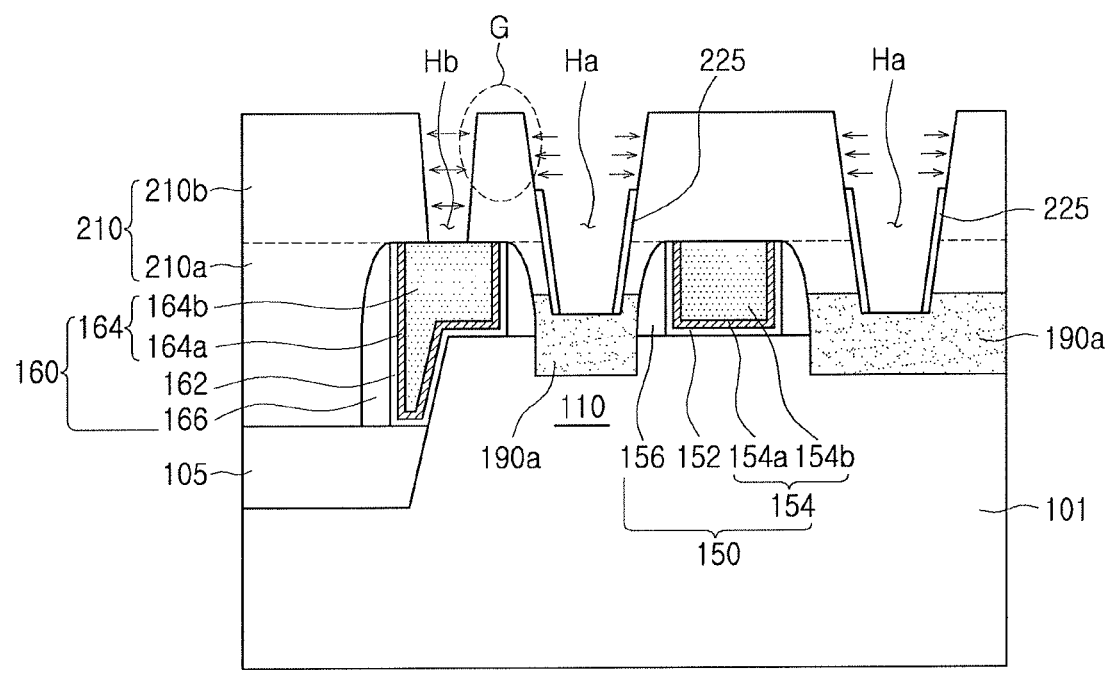

Because the second contact hole Hb does not overlap the first contact hole Ha, a double-etched area may not result from an etching process of forming the second contact hole Hb, as illustrated in FIG. 16. For example, a bulkhead obtained from the insulating layer 210 may be formed between the first contact hole Ha and the second contact hole Hb. The thickness t of the bulkhead between the first contact hole Ha and the second contact hole Hb may be sufficient to be selectively removed in a subsequent process. The thickness t of the bulkhead may be in a predetermined range, e.g., 50 nm or less or 10 nm to 20 nm.

Since the first contact hole Ha and the second contact hole Hb are not formed to overlap, the sidewall spacer 166 or other structures may be effectively protected from damage caused by a double etching process.

Subsequently, a process may be performed to enlarge a contact hole. Such enlargement may be realized, for example, using a pre-cleaning process performed before a conductive barrier layer is formed. In one embodiment, an etchant selectively removing the insulating layer 210 may be added to a cleaning fluid used in the pre-cleaning process. As a result, an interior of the first contact hole Ha and the second contact hole Hb may be simultaneously cleaned and the first contact hole Ha and the second contact hole Hb (in directions of arrows in FIG. 16) may be enlarged. A wiring in an upper layer (to be formed in a subsequent process) and an effective contact may be guaranteed using the process of enlarging a contact hole.

Figure 17:
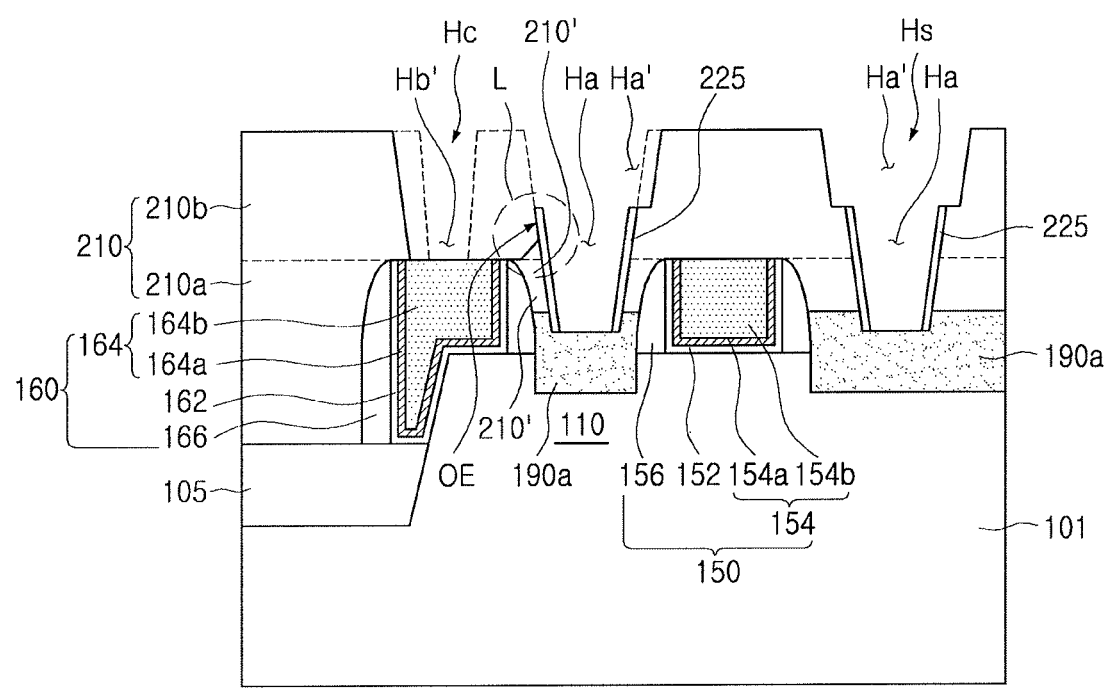

After the pre-cleaning process, the first contact hole Ha and the second contact hole Hb may be partially or entirely enlarged, as illustrated in FIG. 17.

In a second contact hole Hb', additional etching is performed on an entirety of an exposed surface, to thereby entirely enlarge a hole. On the other hand, the first contact hole Ha may be partially enlarged only in an upper area Ha' thereof. Since, in the pre-cleaning process according to an example embodiment, the plug spacer film 225 has a relatively high selective etching rate with respect to the insulating layer 210, a lower area thereof in which the plug spacer film 225 is formed may be not be etched.

A portion G of the bulkhead between the first contact hole Ha and the second contact hole Hb may be easily removed in such a manner that opposing sidewalls thereof exposed to the first contact hole Ha and the second contact hole Hb are simultaneously etched. The portion G of the bulkhead may be removed, thereby forming a hole structure in which upper areas of the first contact hole Ha and the second contact hole Hb are connected, as illustrated in FIG. 17.

In an example embodiment, a residual portion of the insulating layer 210 may be removed from an area L adjacent to an upper portion of the plug spacer film 225. This exposes a portion of a surface adjacent to the second contact hole Hb of the plug spacer film 225. As illustrated in FIG. 17, the residual portion 210a' of an insulating layer between the first lower portion CA1 and the second lower portion CB1 may be formed to be lower than an upper end of the plug spacer film 225.

Figure 18:
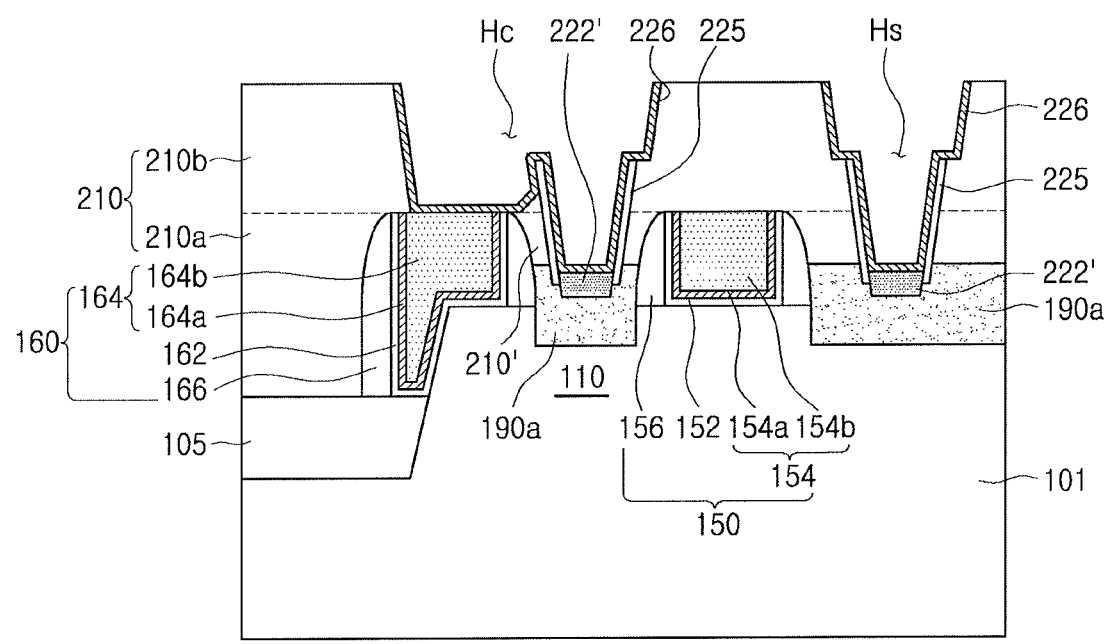

Subsequently, as illustrated in FIG. 18, a metal layer 222' may be formed in a recess of the active area 190a. Also, a conductive barrier film 226 covering internal surfaces of a shared contact hole Hc and a single contact hole Hs may be formed. The metal layer 222' may include, for example, a metal used for a metal silicide. For example, the metal may be Ti, Co, Ni, Ta, Pt, or combinations thereof. The metal layer 222' may be formed using, for example, a physical vapor deposition (PVD) process.

The conductive barrier film 226 may be formed to conformally cover an entirety of the internal surfaces of the shared contact hole Hc and the single contact hole Hs. A process described above may be performed using, for example, the PVD process, a chemical vapor deposition (CVD) process, or an atomic layer deposition (ALD) process. The conductive barrier film 226 may be formed using TiN, TaN, AlN, WN, or combinations thereof, or another material.

Figure 19:
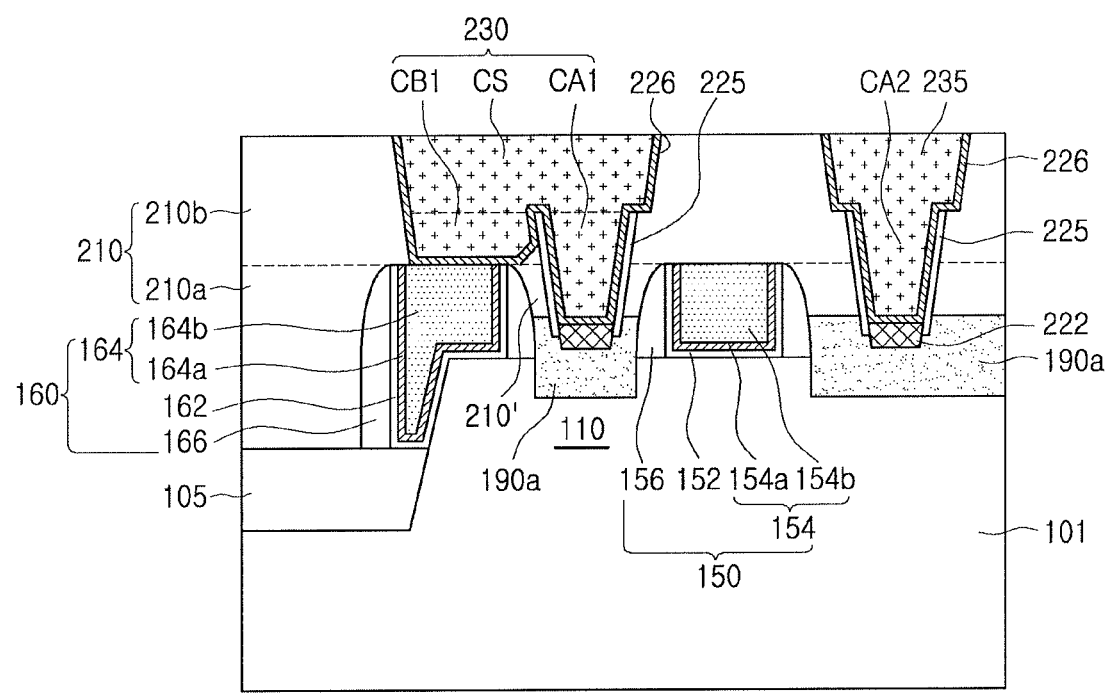

Subsequently, as illustrated in FIG. 19, a metal silicide film 222 may be formed using the metal layer 222'. Also, a conductive material may be filled in the shared contact hole Hc and the single contact hole Hs, to thereby form a shared contact plug 230 and a single contact plug 235. The metal silicide film 222 may be obtained in such a manner that the metal layer 222' is heat treated to react with a semiconductor material of the active area 190a. In a heat treatment process, a laser annealing process may be used. The conductive material may be formed using, for example, W, Cu, Al, alloys thereof, or combinations thereof.

The shared contact plug 230 employed in an example embodiment may be divided into lower portions CA1 and CB1 and an upper portion CS. According to an example embodiment, the shared contact plug 230 may include the first lower portion CA1, the second lower portion CB1, and the upper portion CS based on a level of the upper end of the plug spacer film 225. The first lower portion CA1 may be connected to the active area 190a provided as the source/drain region. The second lower portion CB1 may be connected to the second gate structure 160. The upper portion CS may be integrally formed on upper surfaces of the first lower portion CA1 and the second lower portion CB1 to share two contacts.

In an example embodiment, the plug spacer film 225 may be formed to surround the first lower portion CA1. The plug spacer film 225 may be formed between the first lower portion CA1 and the insulating layer 210 and may have a selective etching rate with respect to the insulating layer 210, to thereby maintain an initial profile, even in an enlarging process (e.g., the pre-cleaning process) to connect the first contact hole Ha to the second contact hole Hb (see FIG. 17).

An example in which a plug spacer film is only applied in the case of a contact plug for the source/drain region (a relatively low level of a contact area) has been described. In one embodiment, the plug spacer film may be applied to an entirety of two contact holes (e.g., FIGS. 20A to 20D) or other contact holes (e.g., FIGS. 21A to 21C) to be shared.

FIGS. 20A to 20D are cross-sectional views of stages of another embodiment of a method for manufacturing a semiconductor device. This embodiment illustrates an example in which a plug spacer film is applied to an entirety of two contact holes to be shared. Descriptions of each component and process will be provided with reference to processes of FIGS. 10 to 19.

Figure 20A:
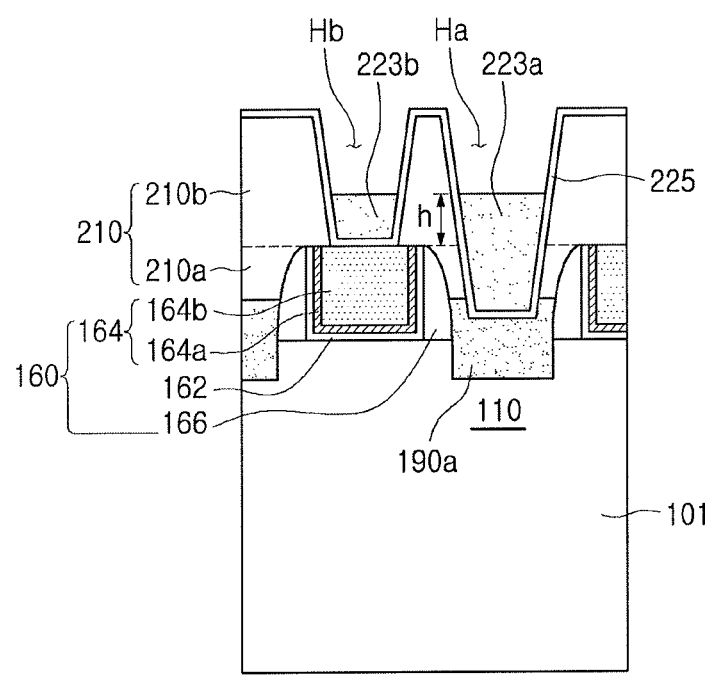
FIGS. 20A to 20D illustrate stages in another embodiment of a method for manufacturing a semiconductor device.

With reference to FIG. 20A, a material layer 225" for the plug spacer film may be deposited on an entirety of a surface of an insulating layer 210. Also, a first filled mask pattern 223a and a second filled mask pattern 223b to perform a first patterning of the material layer 225" may be formed in a first contact hole Ha and a second contact hole Hb, respectively. The first filled mask pattern 223a and the second filled mask pattern 223b may be simultaneously formed, for example, using the same etch-back process. Upper ends of the first filled mask pattern 223a and the second filled mask pattern 223b may be formed to be higher than a gate structure 160 by a height h.

Figure 20B:
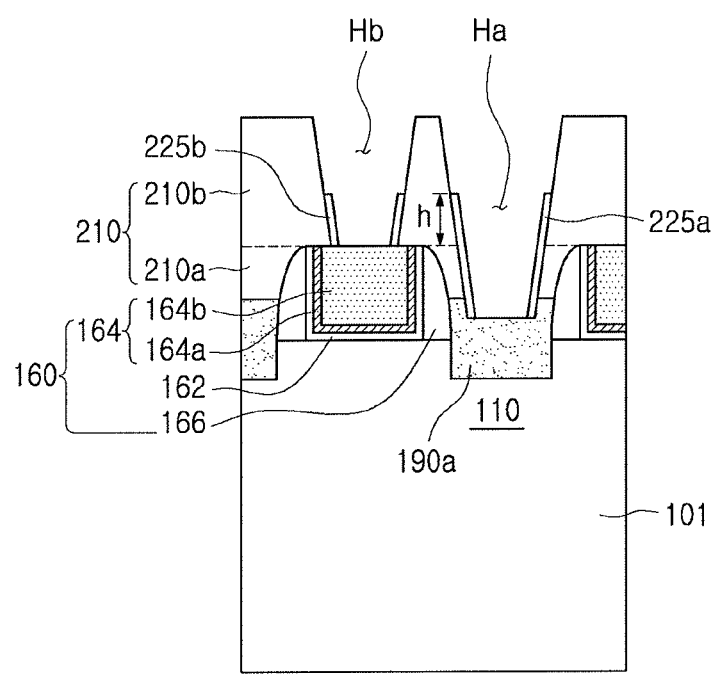

Subsequently, an exposed portion of the material layer 225" may be selectively removed using filled mask patterns 223a and 223b in the first contact hole Ha and the second contact hole Hb. The filled mask patterns 223a and 223b may be removed, and a portion of a spacer on a bottom surface of the first contact hole Ha and the second contact hole Hb may be selectively removed. As a result, as illustrated in FIG. 20B, plug spacer films 225a and 225b with predetermined characteristics may be formed on internal sidewalls of the first contact hole Ha and the second contact hole Hb.

Figure 20C:
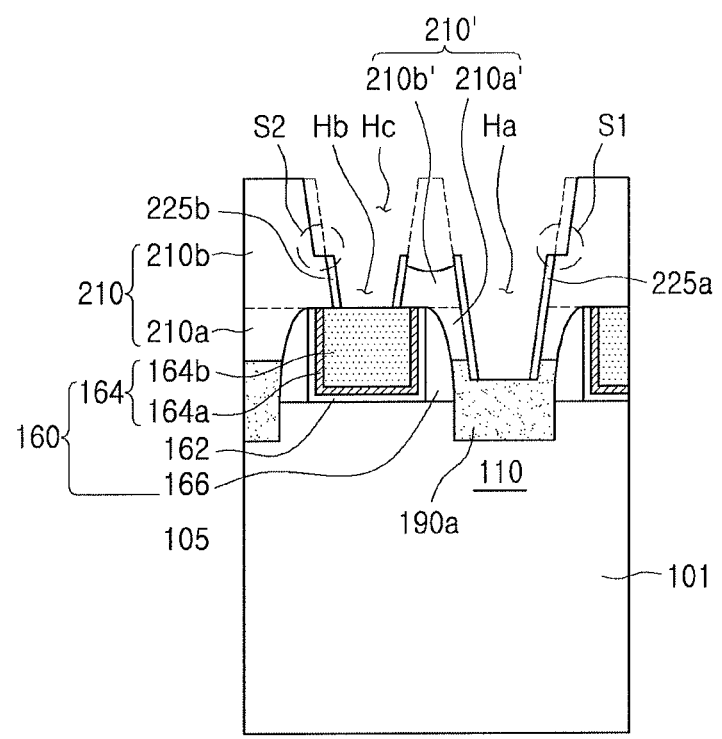

Subsequently, a process of enlarging a contact hole may be performed. For example, the first contact hole Ha and the second contact hole Hb may be enlarged using a pre-cleaning process performed before a conductive barrier layer is formed. Interiors of the first contact hole Ha and the second contact hole Hb may be cleaned, while the first contact hole Ha and the second contact hole Hb may be enlarged, as illustrated in FIG. 20C. Wiring in an upper layer to be formed in a subsequent process and an effective contact may be guaranteed using the process of enlarging a contact hole. Also, a portion of a bulkhead between the first contact hole Ha and the second contact hole Hb may be removed. Thus, an upper area Hc in which the first contact hole Ha is connected to the second contact hole Hb may be formed.

In an example embodiment, a residual portion 210a' of an insulating layer between the first contact hole Ha and the second contact hole Hb may be additionally etched. A residual portion 210b' of an insulating layer on the gate structure may be lower than upper ends of the first plug spacer film 225a and the second plug spacer film 225b.

After the process of enlarging a contact hole, the internal sidewalls of the first contact hole Ha and the second contact hole Hb may include steps S1 and S2 on the upper ends of the plug spacer films 225a and 225b. For example, the first contact hole Ha and the second contact hole Hb may have a form in which an upper area Hc is enlarged compared with a lower area thereof.

Figure 20D:
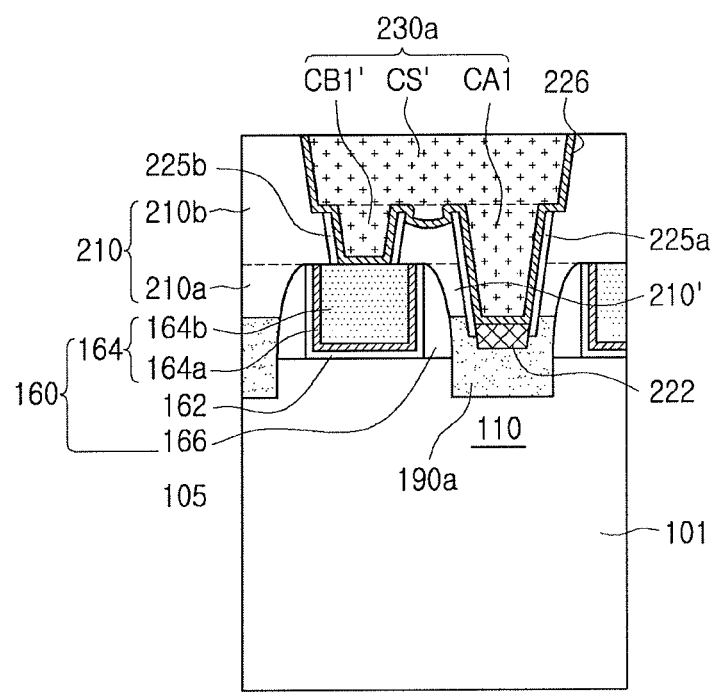

Subsequently, with reference to FIG. 20D, a desired shared contact plug 230a may be formed using processes of forming a metal silicide layer 222, a conductive barrier film 226, and a contact plug (e.g., see FIGS. 18 and 19). The shared contact plug 230a my include a second lower portion CB1' and an upper portion CA having a form different from that of an example embodiment described above by introducing an additional second plug spacer film 225b.

Figure 21A:
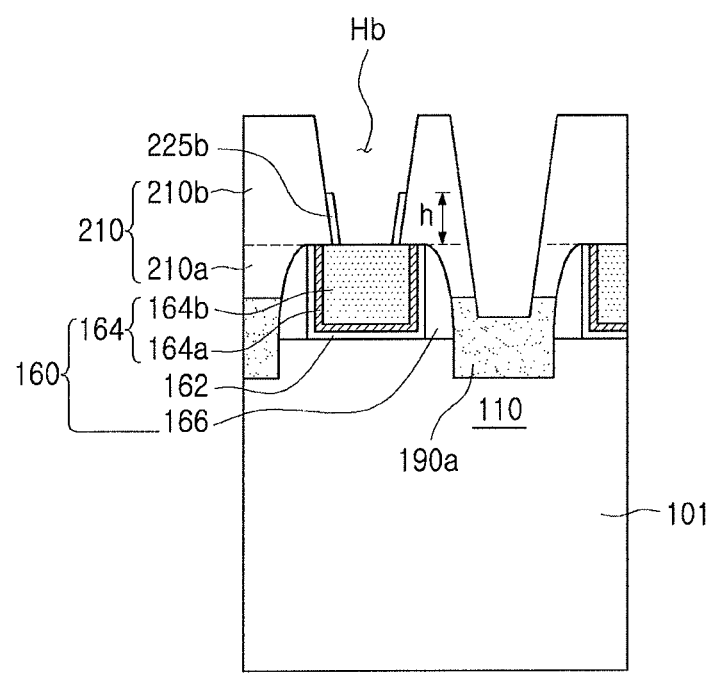
FIGS. 21A to 21C illustrate stages in another embodiment of a method for manufacturing a semiconductor device.
Figure 21B:
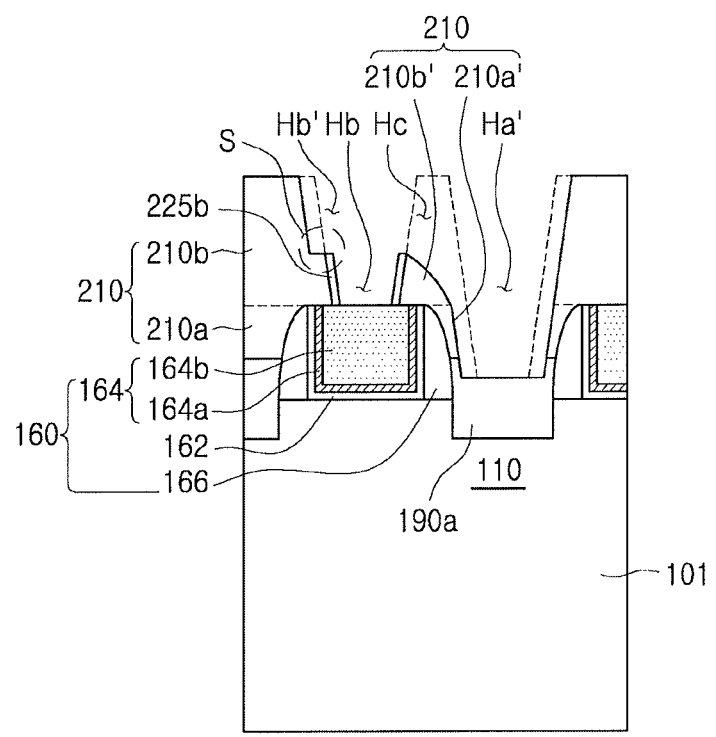
Figure 21C:
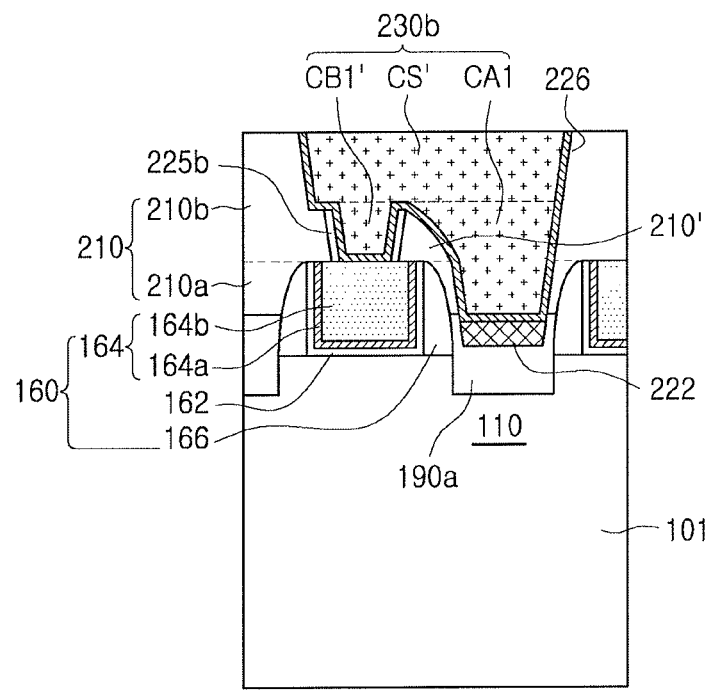

FIGS. 21A to 21C illustrate stages of another embodiment of a method for manufacturing a semiconductor device. In an example embodiment, a plug spacer film is applied to another contact hole (e.g., a gate contact) among contact holes to be shared. Detailed descriptions of each component and process will be provided with reference to the processes of FIGS. 10 to 19.

With reference to FIG. 21A, a plug spacer film 225b may only be formed in a second contact hole Hb. The plug spacer film 225b may be formed using a filled mask pattern, a selective etching process, or another process, as in an example embodiment described above.

Subsequently, as illustrated in FIG. 21B, a first contact hole Ha and the second contact hole Hb may be enlarged using a process of enlarging a contact hole (e.g., a cleaning process before a conductive barrier layer is formed). In an example embodiment, only an upper area Hb' of the second contact hole Hb may be enlarged using a plug spacer film 225b, while the first contact hole Ha may be entirely enlarged. As a result, an upper area Hc in which the first contact hole Ha is connected to the second contact hole Hb after a bulkhead is removed may be formed.

In addition, in an example embodiment, a residual portion 210a' of an insulating layer between the first contact hole Ha and the second contact hole Hb may have a form different from that of an example embodiment described above. A residual portion 210b' of a residual insulating film on a gate structure 160 is illustrated at a height substantially the same as that of upper ends of a first plug spacer film 225a and the second plug spacer film 225b, but may be lower than the upper ends thereof in one embodiment.

Subsequently, with reference to FIG. 21C, a desired shared contact plug 230b may be formed using processes of forming a metal silicide layer 222, a conductive barrier film 226, and a contact plug (e.g., see FIGS. 18 and 19). The shared contact plug 230b may include a second lower portion CB1' and an upper portion CA, having a form different from that of example embodiments described above, by introducing an additional second plug spacer film 225b.

In example embodiments described above, a method is provided in which contact holes to be shared are formed to be spaced apart from each other so that a double-etched area is not present. Also, the contact holes are connected by selectively enlarging only an upper area thereof is provided. The method may not only be applied to a memory device, such as SRAM, but also to various other devices such as but not limited to a logic device, which is illustrated in FIGS. 22 to 26.

Figure 22:
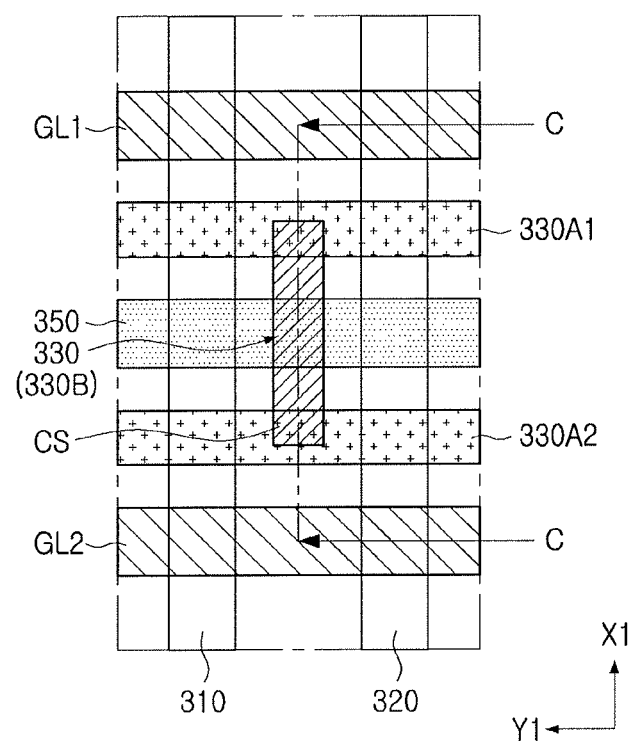
FIG. 22 illustrates a illustrates a layout embodiment of a semiconductor device.
Figure 23:
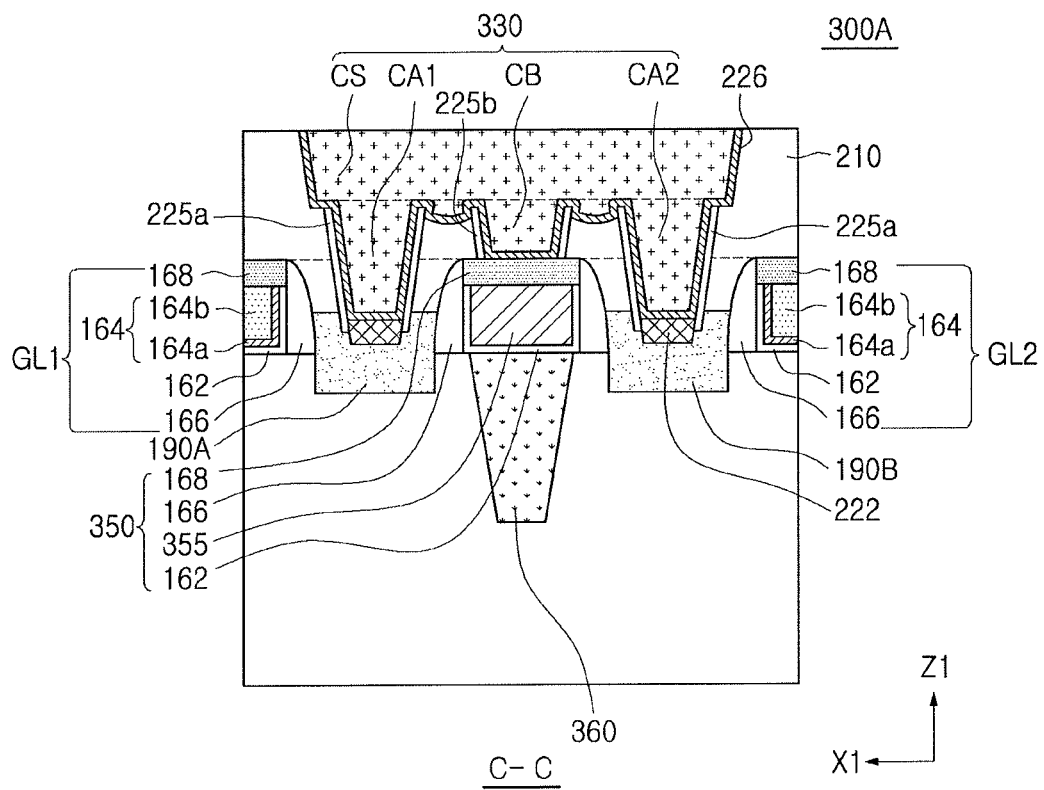
FIG. 23 illustrates an embodiment taken along section line C-C in FIG. 22.

FIG. 22 illustrates another embodiment of a semiconductor device 300A, and FIG. 23 illustrates a cross-sectional view taken along line C-C of FIG. 22. With reference to FIGS. 22 and 23, a semiconductor device 300A may include a first fin-type active pattern 310 and a second fin-type active pattern 320 extended on a substrate 101 in a first direction (e.g., X1 direction). A first gate structure GL1 and a second gate structure GL2 may be extended in a second direction (e.g., Y1 direction) different from the first direction and intersecting a first fin-type active pattern 310 and a second fin-type active pattern 320, respectively.

In the first fin-type active pattern 310, a first active area 190a may be formed on opposing sides of the first gate structure GL1. In a similar manner to a case described above, in the second fin-type active pattern 320, a second active area 190b may be formed on opposing sides of the second gate structure GL2. The first active area 190a and the second active area 190b may be provided as a source/drain region. A first transistor and a second transistor may be defined by an area in which the first fin-type active pattern 310 and the second fin-type active pattern 320 intersect the first gate structure GL1 and the second gate structure GL2 and a periphery thereof (e.g., a first active area and a second active area).

A third gate structure 350 may be between the first active area 190a and the second active area 190b, e.g., between a first contact 330A1 and a second contact 330A2. The third gate structure 350 may be extended in the second direction.

In an example embodiment, the third gate structure 350 may be provided as a dummy gate structure including a dummy structure 355, rather than a gate electrode 164. In addition, in a similar manner to the first gate structure GL1 and the second gate structure GL2, the third gate structure 350 may include a sidewall spacer 166, a gate insulating film 162, and an insulating cap layer 168, disposed on opposing sides thereof.

The first contact 330A1 and the second contact 330A2 of the first transistor and the second transistor may be connected by a third contact 330B on the third gate structure 350. As illustrated in FIG. 23, in an example element, a shared contact plug 330 may include a first lower portion CA1 and a second lower portion CA2, corresponding to lower areas of the first contact 330A1 and the second contact 330A2, a third lower portion CB corresponding to a lower area of the third contact 330B, and an upper portion CS connecting upper surfaces of the first lower portion CA1, the second lower portion CA2, and the third lower portion CB. The first lower portion CA1 and the second lower portion CA2 may be adjacent to a sidewall spacer 166 of the third gate structure 350.

In an example embodiment, the first lower portion CA1, the second lower portion CA2, and the third lower portion CB may include first to third plug spacer films 225a and 225b, surrounding sidewalls thereof, respectively. In another example embodiment, a plug spacer film may be provided only in the first lower portion CA1 and the second lower portion CA2, or may be provided only in the third lower portion CB.

In an example embodiment, a sidewall of the shared contact plug 330 may include a step on an upper end of a plug spacer. Upper ends of the first plug spacer film 225a and the second plug spacer film 225b may be on a level higher than an upper surface of the third gate structure 350. In addition, an insulating layer 210 may include a portion between the first lower portion CA1 and the second lower portion CA2 below the upper portion CS.

As such, since respective contact holes for contacts 330A1 and 330A2 to be shared in an example embodiment may be formed, and upper areas of the contact holes are selectively enlarged to connect only upper areas (e.g., CS) of divided contact holes, the shared contact plug 330 may be formed without a double-etched area.

Figure 24:
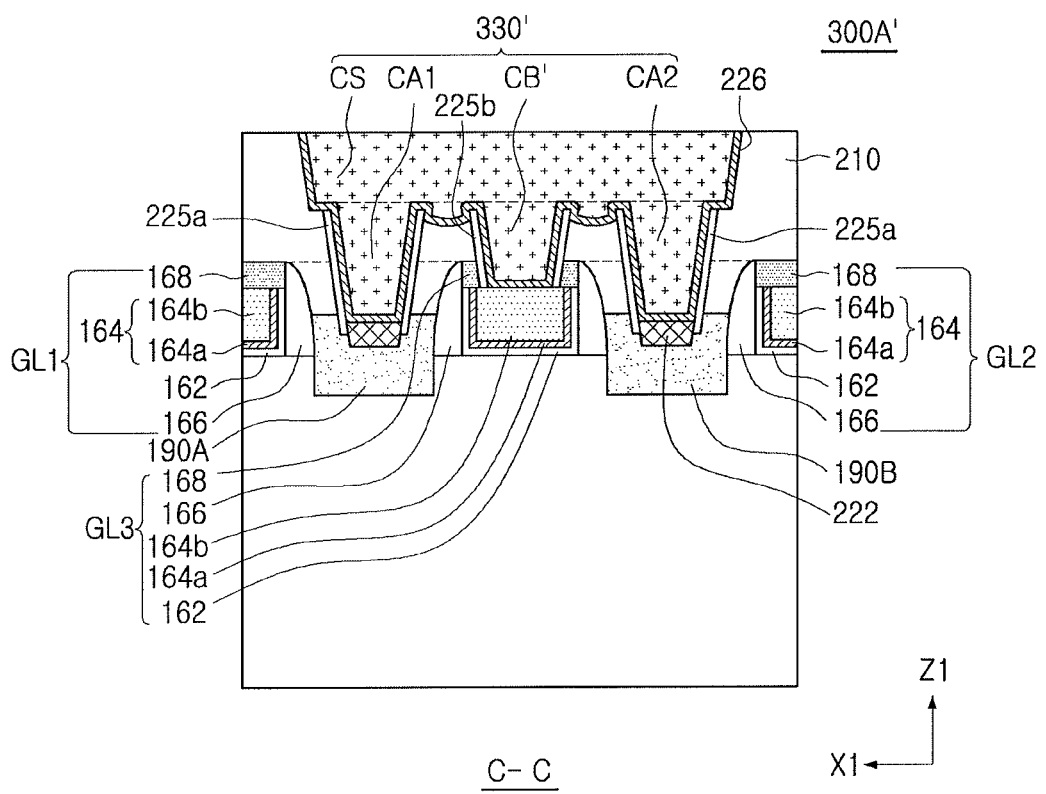
FIG. 24 illustrates another embodiment of a semiconductor device.

FIG. 24 illustrates an example embodiment of a cross section taken along line C-C illustrated in FIG. 22. In the case of a semiconductor device 330A', a third gate structure GL3 may not be provided as a dummy gate structure, but an electrode structure in a similar manner to other gate structures GL1 and GL2.

As illustrated in FIG. 24, in an example embodiment, a shared contact plug 330' may include a first lower portion CA1 and a second lower portion CA2, corresponding to lower areas of a first contact and a second contact (330A1 and 330A2 of FIG. 22), a third lower portion CB' corresponding to a lower area of a third contact (330B of FIG. 22), and an upper portion CS connecting upper surfaces of the first lower portion CAL the second lower portion CA2, and the third lower portion CB'. In an example embodiment, in a manner different from an example embodiment described above, the third gate structure GL3 may have an electrode structure similar to the first gate structure GL1 and the second gate structure GL2. The third lower portion CB' may be connected to gate electrodes 164a and 164b of the third gate structure GL3.

An example embodiment described above illustrates a structure in which a single shared contact connects one contact to another contact. In one embodiment, the contact may be connected to a conductive line as illustrated in FIGS. 25 to 27.

Figure 25:
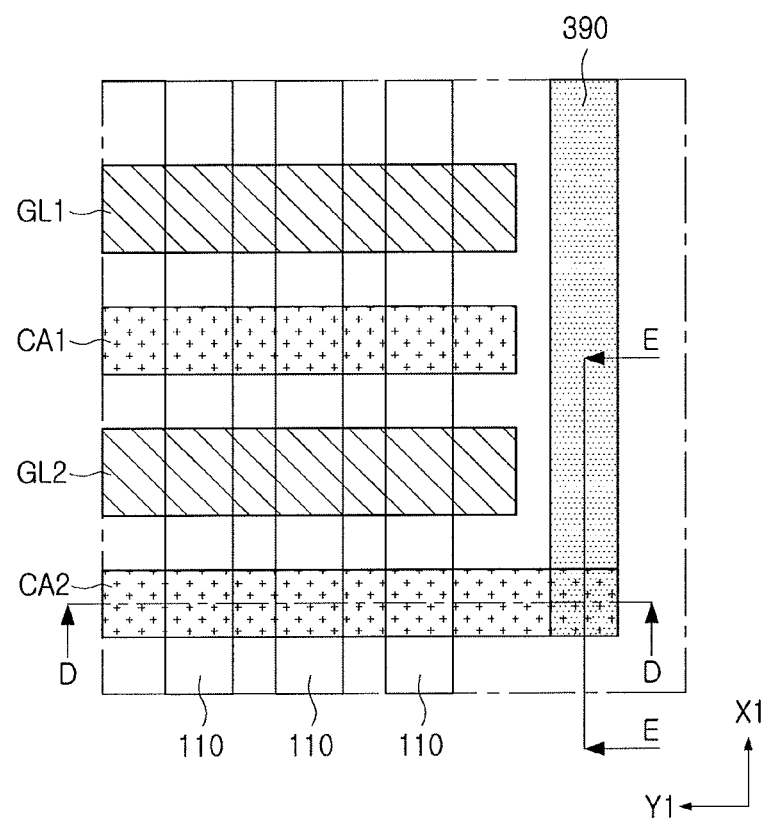
FIG. 25 illustrates another layout embodiment of a semiconductor device.
Figure 26:
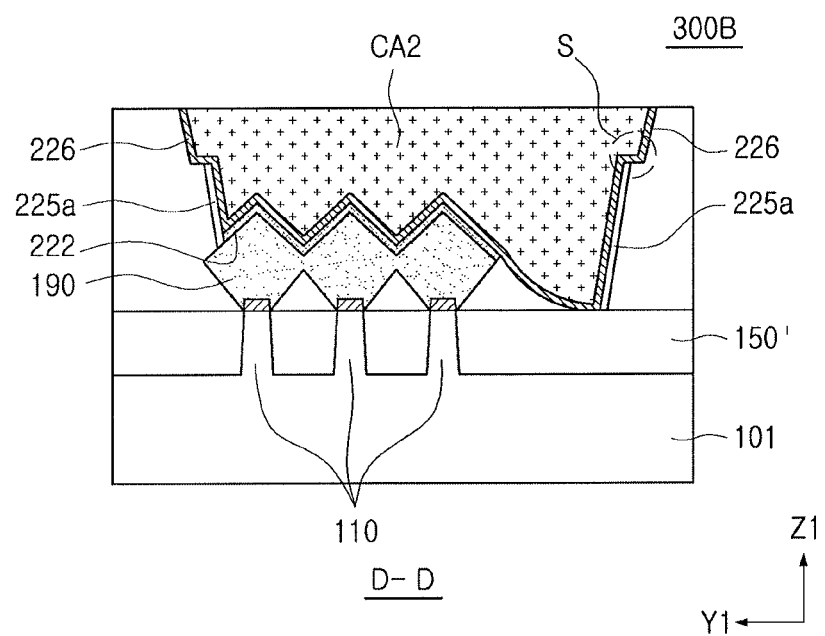
FIGS. 26 and 27 illustrate embodiments along lines D-D and E-E in FIG. 25, respectively.
Figure 27:
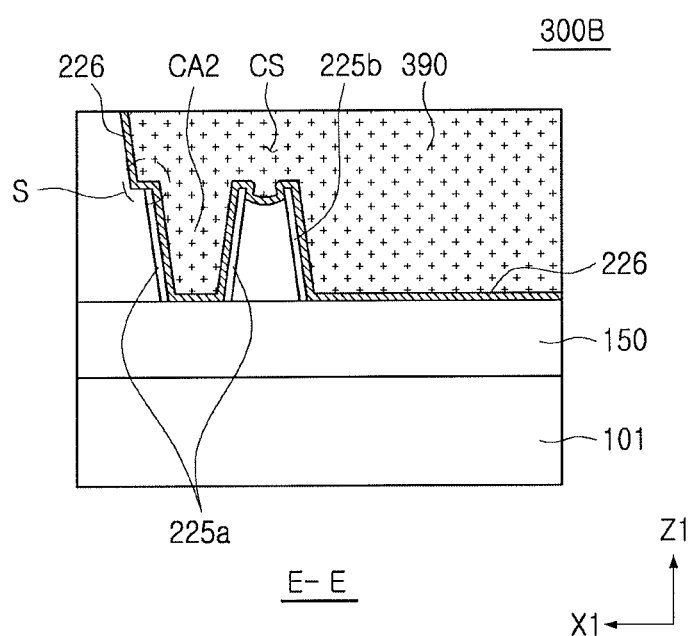

FIG. 25 another embodiment of a semiconductor device 300B, and FIGS. 26 and 27 illustrate cross-sectional embodiments taken along lines D-D and E-E in FIG. 25, respectively.

Referring to FIGS. 25, 26, and 27, the semiconductor device 300B may include three fin-type active patterns 110 extended on a substrate 101 in a first direction (e.g., X1 direction) and a first gate structure GL1 and a second gate structure GL2 extended in a second direction (e.g., Y1 direction), each of which intersects the fin-type active pattern 110.

In an example embodiment, a fin-type active pattern 110 may include active areas 190 for each source/drain, and the active areas 190 may be defined as a transistor together with the first gate structure GL1 and the second gate structure GL2. In an example embodiment, the active areas 190 may have a form in which epitaxial layers regrown from three fins are merged.

As illustrated in FIG. 25, a contact CA2 between contacts CA1 and CA2, connected to an active area of transistor arrays, may be connected to another conductive line 390. For example, the conductive line 390 may be provided as a conductive line, such as a VDD.

As illustrated in FIG. 26, the contact CA2 may be connected to an active area 190 and may be extended to be adjacent to the conductive line 390 on a device isolation area 150'. The contact CA2 may include a first plug spacer film 225a in a lower area thereof. An upper area thereof in which the first plug spacer film 225a is not formed may be enlarged, so that a step S may be on an upper end of the first plug spacer film 225a.

As illustrated in FIG. 27, the conductive line 390 may also be connected to be adjacent to the contact CA2 and may include a second plug spacer film 225b in a lower area thereof. An upper area thereof in which the second plug spacer film 225b is not formed may be enlarged to be connected to the contact CA2. In accordance with at least one embodiment, a method is provided to connect a contact to a conductive line, as well as a shared contact for a plurality of contacts which may be used to connect two conductive structures without generating a double-etched area.

Figure 28:
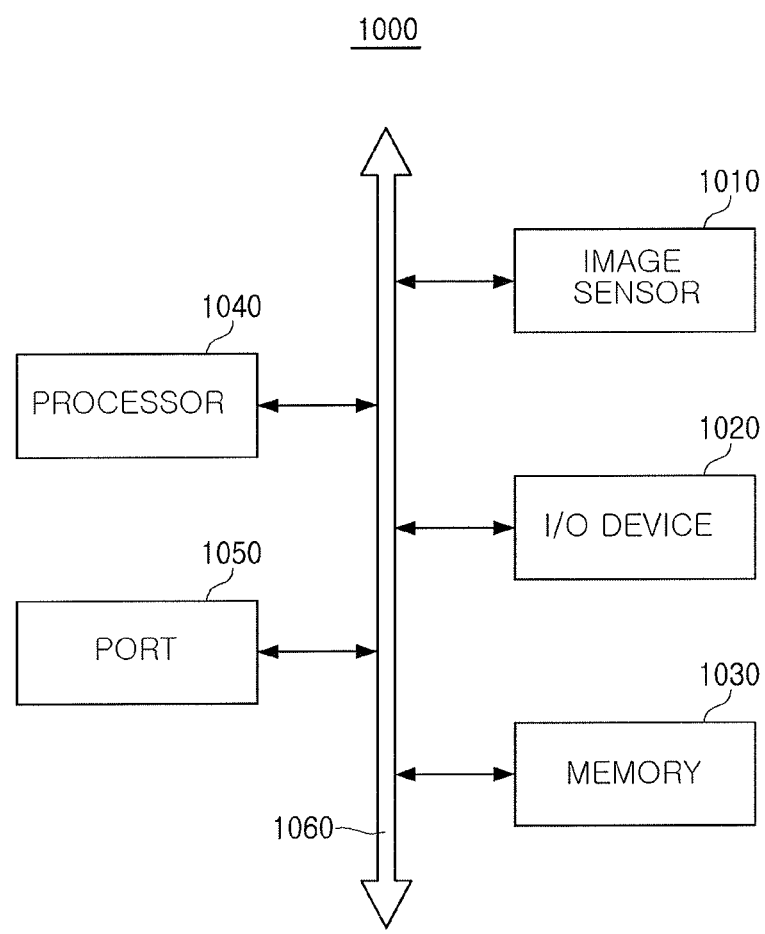
FIG. 28 illustrates an embodiment of an electronic device.

Among components illustrated in FIG. 28, a port 1050 may be provided for a computer device 1000 to communicate with a video card, a sound card, a memory card, a universal serial bus (USB) device, and the like. The computer device 1000 may include a smartphone, a tablet PC, a smart wearable device, a desktop computer, a laptop computer, or another type of electronic device.

A processor 1040 may perform a certain operation, a command, task, and the like. The processor 1040 may be provided as a central processing unit (CPU) or a microprocessor unit (MCU), and may communicate with a memory 1030, an input/output (I/O) device 1020, an image sensor 1010, and other devices connected to the port 1050, through a bus 1060.

The memory 1030 may be provided as a storage medium, storing data necessary for operations of the computer device 1000, or multimedia data. The memory 1030 may be provided as a semiconductor device according to an example embodiment and may include a memory, such as an SRAM, or at least one of a solid state drive (SSD), a hard disk drive (HDD), and an optical disk drive (ODD), including the memory. The I/O device 1020 may include an input device, such as a keyboard, a mouse, and a touchscreen, and an output device, such as a display and an audio output unit, provided to a user.

The image sensor 1010 may include a sensor circuit having a plurality of transistors, and the sensor circuit may be implemented as a semiconductor device 10 according to an example embodiment. In addition, other components, such as the processor 1040, may include a semiconductor device including a shared contact according to an example embodiment.

In accordance with one or more of the aforementioned embodiments, a shared contact may be formed without a double-etched area. Respective divided contact holes may be formed in a plurality of areas to be shared, and upper areas of the separated contact holes may be selectively expanded so that only the upper areas of the separated contact holes are connected. Thus, damage to a gate structure (e.g., a sidewall spacer) caused by overetching may be prevented, and the shared contact may be formed in a compact manner.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
a substrate;
a fin-type active pattern extended on the substrate in a first direction;
a gate structure extended on the substrate in a second direction different from the first direction, the gate structure intersecting the fin-type active pattern, and the gate structure including sidewall spacers on opposite sidewalls thereof;
an active area on a side of the gate structure in the fin-type active pattern and serving as a source/drain region;
an insulating layer on the substrate, the insulating layer covering the fin-type active pattern and the gate structure;
a shared contact plug penetrating through the insulating layer, the shared contact plug including:
a first lower portion and a second lower portion connected to the active area and the gate structure, respectively, the insulating layer having a first portion between the first lower portion and the second lower portion, and
an upper portion connecting upper surfaces of the first lower portion and the second lower portion; and
a silicon nitride film between the first lower portion and the second lower portion, the silicon nitride film surrounding a sidewall of the first lower portion and the second lower portion,
wherein the insulating layer includes a second portion between the silicon nitride film and a corresponding one of the sidewall spacers of the gate structure, and
wherein a bottom of the second lower portion has a flat area and is at a level higher than a bottom of the first lower portion.

2. The semiconductor device as claimed in claim 1, wherein an upper end of the silicon nitride film is positioned between the first lower portion and the second lower portion.

3. The semiconductor device as claimed in claim 2, wherein the upper end of the silicon nitride film is at a level higher than an upper surface of the gate structure.

4. The semiconductor device as claimed in claim 2, wherein the first portion of the insulating layer between the first lower portion and the second lower portion is lower than the upper end of the silicon nitride film.

5. The semiconductor device as claimed in claim 1, wherein the silicon nitride film includes:
a first silicon nitride film surrounding the sidewall of the first lower portion, and
a second silicon nitride film surrounding a sidewall of the second lower portion.

6. The semiconductor device as claimed in claim 1, wherein the entire insulating layer, including the first and second portions of the insulating layer, includes a silicon oxide.

7. The semiconductor device as claimed in claim 1, wherein, in a cross section taken in a direction in which the first lower portion and the second lower portion are arrayed, a width of the upper portion is greater than a maximum width of an exterior corresponding to the first lower portion and the second lower portion.

8. The semiconductor device as claimed in claim 1, wherein the upper surfaces of the first lower portion and the second lower portion are substantially level with each other.

9. The semiconductor device as claimed in claim 1, wherein:
the gate structure includes a gate electrode, the sidewall spacers being on opposite sidewalls of the gate electrode,
the first portion of the insulating layer covers an upper portion of a corresponding one of the sidewall spacers, and
the second lower portion is electrically connected to the gate electrode.

10. A semiconductor device, comprising:
a substrate;
a first fin-type active pattern and a second fin-type active pattern, extended on the substrate in a first direction;
a first gate structure and a second gate structure extended on the substrate in a second direction different from the first direction, the first gate structure and the second gate structure intersecting the first fin-type active pattern and the second fin-type active pattern, respectively;
a first active area in the first fin-type active pattern, the first active area being adjacent to the first gate structure and serving as a first source/drain region;
a second active area in the second fin-type active pattern, the second active area being adjacent to the second gate structure and serving as a second source/drain region;
a third gate structure extended in the second direction between the first active area and the second active area;
an insulating layer on the substrate, the insulating layer covering the first fin-type active pattern, the second fin-type active pattern, and the first to third gate structures;
a shared contact plug penetrating through the insulating layer, the shared contact plug including:
a first lower portion and a second lower portion connected to the first active area and the second active area, respectively,
a third lower portion on the third gate structure, and
an upper portion connecting upper surfaces of the first to third lower portions;
a first silicon nitride film between the first lower portion and the third lower portion, the first silicon nitride film surrounding a sidewall of the first lower portion; and
a second silicon nitride film between the second lower portion and the third lower portion, the second silicon nitride film surrounding a sidewall of the second lower portion,
wherein the insulating layer includes a first portion between the first lower portion and the third lower portion, and a second portion between the second lower portion and the third lower portion,
wherein a bottom of the third lower portion has a flat area and is at a level higher than bottoms of the first and second lower portions, and
wherein the first and second silicon nitride films are only on sidewalls of the first and second lower portions, respectively, among all surfaces of each of the first and second lower portions, bottoms of the first and second lower portions being directly connected to the first and second source/drain regions, respectively.

11. The semiconductor device as claimed in claim 10, wherein an upper end of each of the first and second silicon nitride films is at a level higher than an upper surface of the third gate structure.

12. The semiconductor device as claimed in claim 10, wherein the insulating layer includes a silicon oxide.

13. The semiconductor device as claimed in claim 10, wherein the third gate structure is a dummy gate structure.

14. A semiconductor device, comprising:
- a source/drain region in a fin-type active pattern;
- a gate structure adjacent to the source/drain region, the gate structure including sidewall spacers on opposite sidewalls thereof;
- a silicon oxide layer on the source/drain region and the gate structure;
- a shared contact plug penetrating through the silicon oxide layer, the shared contact plug including:
  - a first lower portion connected to the source/drain region,
  - a second lower portion connected to the gate structure, a bottom of the second lower portion having a flat area and is at a level higher than a bottom of the first lower portion, and
  - an upper portion connected to upper surfaces of the first lower portion and the second lower portion; and
- a silicon nitride film surrounding a sidewall of the first lower portion,
- wherein the silicon oxide layer includes a first portion between the silicon nitride film and a corresponding one of the sidewall spacers of the gate structure.

15. The semiconductor device as claimed in claim 14, wherein the silicon oxide layer further includes a second portion between the first and the second lower portions.

16. The semiconductor device as claimed in claim 15, wherein the second portion of the silicon nitride film between the first and the second lower portions extends along the first portion of the silicon oxide layer between the first lower portion and the second lower portion.

17. The semiconductor device as claimed in claim 15, wherein the second portion of the insulating layer between the first and the second lower portions is lower than an upper end of the silicon nitride film.

\* \* \* \* \*